United States Patent
Pourquier

(10) Patent No.: US 12,538,617 B2
(45) Date of Patent: Jan. 27, 2026

(54) 3D LIGHT-EMITTING DIODE AND ASSOCIATED MANUFACTURING METHOD

(71) Applicant: ALEDIA, Champagnier (FR)

(72) Inventor: Eric Pourquier, Saint Jean de Vedas (FR)

(73) Assignee: ALEDIA, Champagnier (FR)

( * ) Notice: Subject to any disclaimer, the term of this patent is extended or adjusted under 35 U.S.C. 154(b) by 0 days.

(21) Appl. No.: 19/222,556

(22) Filed: May 29, 2025

(65) Prior Publication Data

US 2025/0374716 A1    Dec. 4, 2025

(30) Foreign Application Priority Data

May 30, 2024  (FR) ....................... 2405602

(51) Int. Cl.
*H10H 20/821*    (2025.01)
*H10H 20/01*     (2025.01)

(52) U.S. Cl.
CPC .... *H10H 20/821* (2025.01); *H10H 20/01335* (2025.01)

(58) Field of Classification Search
CPC .................................................. H10H 20/821
USPC ........................................................... 257/99
See application file for complete search history.

(56) References Cited

U.S. PATENT DOCUMENTS

| | | | |
|---|---|---|---|
| 2019/0214529 A1* | 7/2019 | Ahmed | H10H 20/82 |
| 2020/0313040 A1 | 10/2020 | Nishioka et al. | |
| 2023/0163233 A1 | 5/2023 | Kim et al. | |

FOREIGN PATENT DOCUMENTS

WO    2024/042221 A1    2/2024

OTHER PUBLICATIONS

Chen et al.; "Effects of spin-polarized injection and photoionization of MnZnO film on GaN-based lightemitting diodes"; Optics Express; vol. 18, No. 3; Feb. 2010; pp. 2302-2308.
Kim et al.; "Enhancement of the Optical Output Power of InGaN/GaN Multiple Quantum Well Light-Emitting Diodes by a CoFe Ferromagnetic Layer"; ACS Photonics; vol. 2, No. 11; 2015; pp. 1519-1523.
Han et al.; "Improved efficiency of InGaN/GaN light-emitting diodes with perpendicular magnetic field gradients"; Optics Express; vol. 27, No. 25; Dec. 2019; pp. 36708-36716.
Written Opinion and Preliminary Search Report issued in FR2405602 by the French Patent Office on Jan. 10, 2025, all pages.

* cited by examiner

*Primary Examiner* — Hsin Yi Hsieh
(74) *Attorney, Agent, or Firm* — B. Aaron Schulman, Esq.; Stites & Harbison, PLLC

(57) ABSTRACT

One or more embodiments relate to a light-emitting diode and its manufacturing method. The diode includes at least one radial three-dimensional (3D) structure including a core having a first conductivity, and having a wire or pyramidal shape with edges substantially parallel or oblique to the direction z, an active region configured to emit light radiation, the active region including at least one radial part covering the edges of the core, a shell having a second conductivity, the light-emitting diode including a magnetic layer having a polarization along a main direction substantially parallel to the direction z, so as to increase a residence time at the active region of at least one among the first type and the second type of carriers.

20 Claims, 18 Drawing Sheets

3D LIGHT-EMITTING DIODE AND ASSOCIATED MANUFACTURING METHOD

TECHNICAL FIELD

The present invention relates to the field of optoelectronics. The invention is particularly advantageous for the manufacture of optoelectronic devices having a three-dimensional (3D) structure, for example light-emitting diodes based on nanowires.

PRIOR ART

A light-emitting diode (LED) typically comprises regions for injecting carriers (electrons and holes) between which an active region is interposed. The active region is the location where radiative electron-hole pair recombinations, which make it possible to obtain a light emission, take place. This active region can in particular comprise quantum wells, for example based on InGaN. LEDs having a three-dimensional structure (3D LEDs), typically in the form of nanowires or pyramids, can have different architectures, particularly in terms of the arrangement of the different constituent regions of the LED.

These different regions can be arranged radially around the longitudinal direction z. Such an LED architecture is referred to as radial or core-shell. A radial 3D LED typically has an elongated inner part (the core) along z and bearing on a substrate, an active region surrounding the inner part, and an outer part (the shell) surrounding the active region. The inner part is generally intended for injecting electrons and the outer part for injecting holes. The active region typically has quantum wells extending parallel to the longitudinal direction z in the case of nanowire type radial 3D LEDs, or oblique in the case of pyramidal type radial 3D LEDs.

To improve the radiative recombination rate, i.e. the external quantum efficiency (EQE) of 3D LEDs, an existing solution is to confine carriers within the active region by adding one or more carrier blocking layers around the active region.

In particular, an electron blocking layer (EBL) can be added between the hole injection region and the active region. This EBL layer prevents electrons from the electron injection region from passing through the active region without being recombined. The EBL layer is configured to block electrons and allow holes to pass.

In practice, the introduction of these EBL layers gives rise to other problems, particularly the appearance of structural defects, the appearance of electrical series resistances and/or an undesirable deceleration of the carriers that must pass through these layers. From a technological point of view, the formation of EBL layers in 3D LED architectures is not sufficiently controlled. There is therefore a need to design a radial 3D LED architecture with an enhanced EQE. The present invention aims to meet this need and/or at least partially overcome the aforementioned drawbacks.

In particular, an object of the present invention is that of providing a light-emitting diode with a radial 3D structure, of nanowire or pyramidal type, having an optimized EQE. Another object of the present invention is that of providing a method for manufacturing such a light-emitting diode.

The other objects, features and advantages of the present invention will be clear after an examination of the following description and the accompanying drawings. It is understood that other advantages can be incorporated. In particular, certain features and certain advantages of the device may apply mutatis mutandis to the method, and vice versa.

SUMMARY

To achieve this objective, according to a first aspect, a light-emitting diode is provided comprising at least one radial three-dimensional 3D structure comprising:
  a core having a first conductivity of a first carrier type, the core having a wire or pyramidal shape oriented along a direction z, and having edges substantially parallel or oblique to the direction z,
  an active region configured to emit a light radiation of wavelength A, the active region comprising at least one so-called radial part covering the edges of the core,
  a shell having a second conductivity of a second carrier type, the shell covering at least the radial part of the active region, Advantageously, the diode comprises at least one magnetic layer configured to have a polarization along a main direction substantially parallel to the direction z, so as to increase the residence time at the active region of at least one among the first type and the second type of carriers.

Thus, the magnetic layer generates a magnetic field substantially in the axis of the wire or pyramidal 3D structure. At the active region, the velocity components perpendicular to the magnetic field of the charge carriers, and particularly the electrons, are substantial. The magnetic field generated thus disrupts the trajectory of the electrons, making it possible to keep electrons longer in the active region comprising the quantum wells. The magnetic field generated may even cause trapping of the charge carriers, and particularly the electrons, in the non-uniformities of the quantum wells, typically rich in indium. It is therefore understood that this architecture makes it possible to enhance the EQE.

The core of the 3D structure is typically based on or made of GaN-n. The shell of the 3D structure is typically based on or made of GaN-p. The magnetic layer typically causes a modification of the trajectory of the electrons propagated in the GaN-n core so as to maintain their residence time in the active region and increase the radiative recombination possibilities.

Another aspect relates to a method for producing a light-emitting diode comprising at least one three-dimensional 3D structure, according to the first aspect, the method comprising:
  forming the core by epitaxy on a growth substrate, by localized growth through an opening of a masking layer disposed on the growth substrate,
  forming the active region on the core by epitaxy,
  forming the shell by epitaxy on the active region, then
  depositing the at least one magnetic layer such that said magnetic layer has a polarization along a main direction substantially parallel to the direction z.

The effects and advantages described above apply to the method according to this aspect.

BRIEF DESCRIPTION OF THE DRAWINGS

The goals, objects, features and advantages of the invention will be better understood from the detailed description of an embodiment of the latter that is illustrated by the following accompanying drawings in which:

FIGS. 5 to 16A schematically illustrate different steps of a method for producing a 3D LED comprising a magnetic layer, according to an exemplary embodiment of the present invention.

Figure 1:
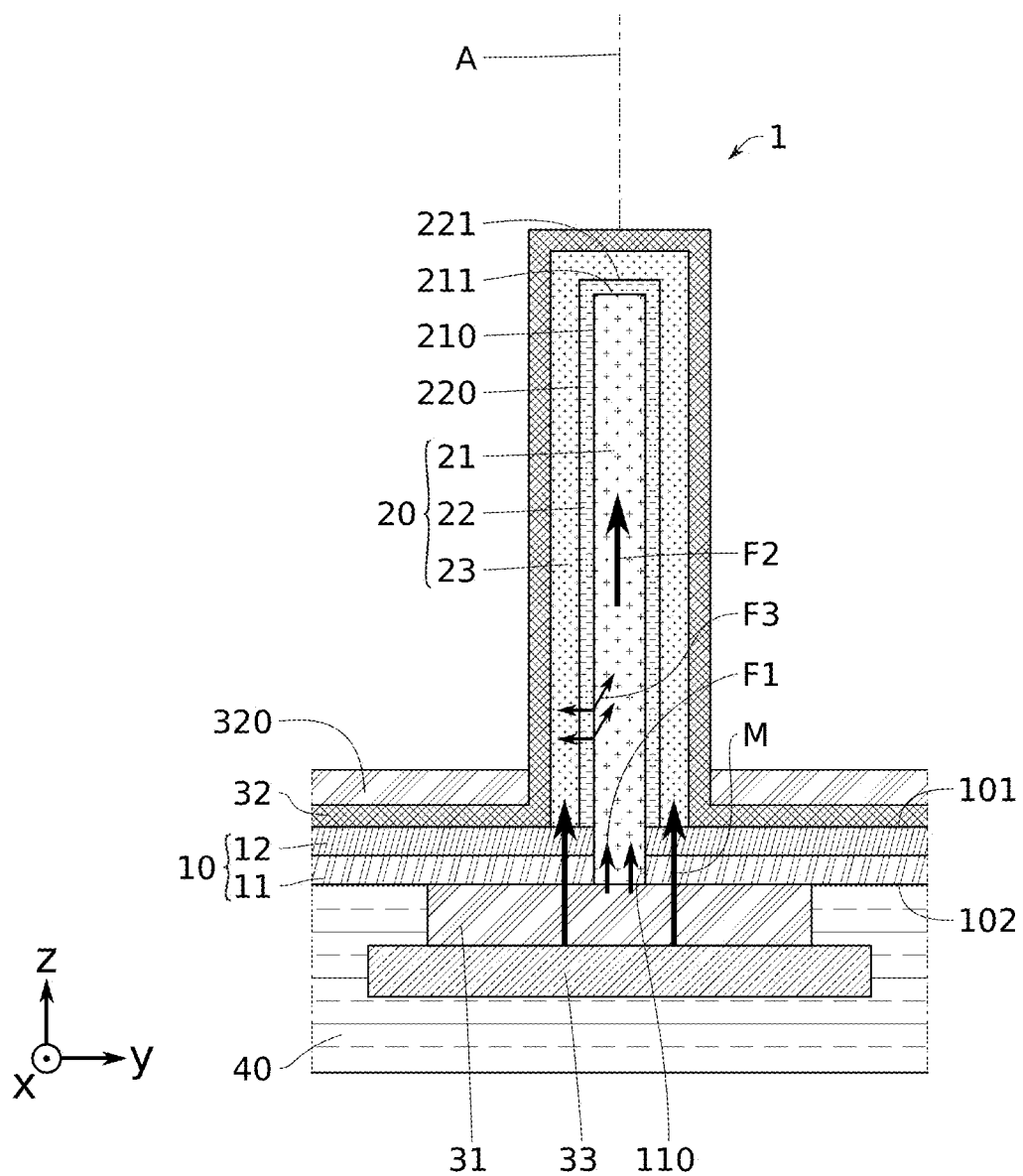
FIG. 1 illustrates a radial 3D LED in wire form comprising a magnetic layer, according to an exemplary embodiment of the present invention.

The drawings are given as examples and do not limit the invention. They constitute schematic outline representations intended to facilitate understanding of the invention and are not necessarily plotted to the scale of practical applications. In particular, the dimensions of the different layers and the different parts of the 3D LEDs do not necessarily represent reality.

DETAILED DESCRIPTION

Before undertaking a detailed review of embodiments of the invention, optional features are listed below that can optionally be used in combination or alternatively.

According to one example, the carriers of the first type are electrons and the first conductivity is N-type, the carriers of the second type are holes and the second conductivity is P-type, the at least one magnetic layer being configured so as to increase the residence time at the active region of the electrons propagated in the core.

According to one example, the at least one magnetic layer extends in a main extension plane substantially perpendicular to the direction z and comprises patterns distributed according to a pitch p along at least one direction of its main extension plane, so as to form a plurality of portions devoid of magnetic material, and preferably said patterns are distributed according a first lattice of pitch p, along two separate directions of its main extension plane.

The magnetic layer thus has a structure according to a pattern repeated along at least one direction of its main extension plane. The magnetic layer is thus discontinuous, along one and preferably two directions of its main extension plane. These two directions are then preferably perpendicular.

The discontinuity of the magnetic layer makes it possible to generate local magnetic field maxima. This induces strong induced field portions. The charge carrier trajectory disruption effect is thus enhanced in the main expansion plane of the magnetic layer.

According to one example, the at least one magnetic layer has grooves, said grooves being devoid of magnetic materials or the magnetic layer being formed at least in part by said grooves based on or made of a magnetic material According to one example, the at least one magnetic layer has a pad structure, said pads being devoid of magnetic materials or the magnetic layer being formed at least in part by said pads based on or made of a magnetic material.

According to one example, the diode comprises a plurality of 3D structures, the plurality of 3D structures being distributed according to the same pitch p as the patterns of the magnetic layer. The plurality of 3D structures is thus arranged coincident with the patterns of the magnetic layer. The 3D structures are thus arranged in accordance with the local magnetic field maxima. More particularly, the 3D structures can thus be placed in the strong induced field portions, to enhance the EQE further. The plurality of 3D structures can be distributed according to a second lattice of the same pitch p as the first lattice.

According to one example, the at least one magnetic layer has a polarization, preferably a permanent polarization, between 0.1 T and 1.5 T, preferably substantially equal to 0.5 T.

This polarization range makes it possible to generate magnetic fields of intensity between 100 Gauss and 5000 Gauss. During the development of the invention, it was demonstrated that this range was particularly adapted for disrupting the trajectory of the charge carriers in 3D LED structures. This is particularly advantageous for 3D structures having a height along the direction z of the order of one μm, for example between 0.1 μm and 5 μm.

According to one example, the at least one magnetic layer is based on or made of a ferromagnetic material.

According to one example, the at least one magnetic layer is based on or is made of a material comprising at least one element chosen from cobalt, iron and nickel.

According to one example, the at least one magnetic layer is based on or is made of a material chosen from the group consisting of CoFeB, CoFe, NiW, NiFe.

According to one example, the at least one magnetic layer comprises a stack of sublayers, said stack comprising at least one first sublayer based on or made of a ferromagnetic material, disposed between two second sublayers based on or made of a non-magnetic metal material. The magnetic properties can depend on the thickness of the sublayers. In particular, thin sublayers, for example having a thickness of the order of a few nanometers, can have a permanent polarization perpendicular to the main extension plane of the layer. By accumulating thin substrates separated by a non-magnetic material, it is possible to accumulate the polarizations of the magnetic sublayers.

According to one example, the at least one magnetic layer has a thickness between 0.5 nm and 50 nm, preferably between 1 nm and 30 nm. According to one example, the magnetic layer has a thickness between 30 nm and 50 nm.

According to one example:
the edges of the core are substantially parallel to the direction z, and
the radial part of the active region extends along a main extension direction substantially parallel to the direction z.

According to one example, the diode further comprises:
a first electrically conducting contact configured to inject carriers of the first type into the core,
a second electrically conducting contact configured to inject carriers of the second type into the shell.

According to one example, the magnetic layer is subjacent, along the direction z, to the first contact. According to an alternative or combinable example, the magnetic layer is above, along the direction z, the second contact, preferably the magnetic layer has a main extension plane substantially parallel to the masking layer.

According to one example, the diode further comprises at least one electrically insulating layer interposed between the magnetic layer and the first contact.

According to one example, the diode further comprises at least one electrically insulating layer interposed between the magnetic layer and the second contact.

According to one example, the diode further comprises a masking layer having a so-called bottom face, a so-called top face, and openings, and the core passes through the masking layer at said openings.

This structural feature of the 3D LED is typically associated with a localized SAG (Selective Area Growth) 3D structure growth method. The presence of the masking layer is generally a residual element of the implementation of localized SAG growth. Such a masking layer is not present in so-called planar 2D LEDs. Mesa-structured LEDs by planar layer etching, according to a technological approach referred to as "top-down", do not have a masking layer. The masking layer is generally specific to the implementation of an SAG method for 3D structure formation, according to a technological approach referred to as "bottom-up". The presence of the masking layer is a means for differentiating between "bottom-up" 3D LEDs and "top-down" LEDs obtained from planar technologies.

According to one example, the three-dimensional structure is obtained by localized growth through the openings of the masking layer.

The openings of the masking layer can be evenly distributed in the form of a lattice. A portion at the base of the core of the 3D structure is typically enclosed by the masking layer. The core can furthermore expand above the enclosed portion, and bear on the masking layer.

According to one example, the at least one magnetic layer is above, along the direction z, the masking layer.

According to one example, the radial part forms at least 80% of the active region.

Due to the effects and benefits described above, it is understood that the EQE can be enhanced without necessarily using an EBL.

According to one example, the 3D LED further comprises a blocking layer of the first carrier type interposed between the shell and the active region. A synergistic effect between the disruption of the carrier trajectory due to the magnetic layer, on one hand, and the blocking of the carriers due to the blocking layer, on the other, can thus be obtained.

According to one example, the core and the shell are based on or made of GaN, and the active region comprises quantum wells based on or made of InGaN.

According to one example, the magnetic layer extends transversely, and particularly perpendicularly or obliquely, to said radial portion. According to one example, the main extension plane of the magnetic layer is transverse, and in particular perpendicular or oblique, to the main extension direction of the radial part of the active region.

According to one example, the method further comprises:
depositing a planarization layer on the growth substrate, on and around the at least one 3D structure protruding from the growth substrate, so as to obtain a planar surface above the at least one 3D structure,
bonding a handling substrate on said planar surface,
removing the growth substrate so as to expose the masking layer and a portion of the core through the masking layer.

According to one example, the method further comprises:
after removing the growth substrate, forming the first contact on contact with the exposed portion of the core,
following the formation of the first contact, depositing the magnetic layer on a bottom face of the masking layer.

The magnetic layer is thus disposed on the back face of the diode, which facilitates its deposition and structuring.

According to one example, the method further comprises, between the formation of the first contact and the deposition of the magnetic layer, a formation of an electrically insulating layer such that the electrically insulating layer is interposed between the first contact and the magnetic layer.

According to one example, the method further comprises:
forming the second contact on the shell, for example by depositing a transparent conducting oxide layer, and
depositing the magnetic layer on the second contact, preferably along a main extension plane substantially parallel to the masking layer.

These steps can take place prior to depositing the planarization layer. According to an alternative example, when the magnetic layer is deposited on the second contact, the method can be free from the deposition of a planarization layer.

The magnetic layer is thus disposed on the front face of the diode, around the 3D structures. According to this example, the growth substrate can be retained, and serves as contact with the n-type core. The manufacturing method is thus carried out on the front face on the side of the 3D structures. The magnetic layer is deposited on the front face, on the second contact for example, or separated from the second contact by an insulating layer.

According to one example, the method further comprises, between the formation of the second contact and the deposition of the magnetic layer, a formation of an electrically insulating layer such that the electrically insulating layer is interposed between the second contact and the magnetic layer.

According to one example, the handling substrate is based on a transparent material at the wavelength λ. The handling substrate can thus be retained at the end of the method. Alternatively, the handling substrate can be removed at the end of the method, typically when the handling substrate is based on an opaque material such as silicon.

According to one example, the formations of the core and the shell, and the formation of the active region, are performed by metalorganic-vapor phase epitaxy (MOVPE).

According to one example, the light-emitting diode comprises a plurality of 3D structures, and the formation of the cores is such that two adjacent cores are separated from each other by a separation distance substantially less than 20 µm, preferably substantially between 1 µm and 5 µm. The diode cores are thus distributed along the substrate with a high surface density. This promotes radial growth of the parts above each core, particularly the active regions.

Unless incompatible, technical features described in detail for a given embodiment may be combined with the technical features described in the context of other embodiments described for exemplary and non-limiting purposes, so as to form another embodiment which is not necessarily illustrated or described. Of course, such an embodiment is not excluded from the invention.

In the present invention, the device and the method relate in particular to an architecture and to the manufacture of light-emitting diodes (LEDs) with a 3D structure. The invention can be implemented more broadly for different optoelectronic devices with a 3D structure. The invention can therefore also be implemented in the context of laser or photovoltaic devices.

In the present patent application, the terms "light-emitting diode", "LED" or simply "diode" are used as synonyms. An "LED" may also be understood as a "micro-LED".

Unless explicitly stated otherwise, it is specified that, in the context of the present invention, the relative arrangement of a third layer interposed between a first layer and a second layer, does not necessarily mean that the layers are directly in contact with one another, but means that the third layer is either directly in contact with the first and second layers, or separated from these by at least one other layer or at least one other element.

Thus, the terms and expressions "bear" and "cover" or "overlay" or "on" do not necessarily mean "in contact with". Typically, the shell bears on the active region either directly or indirectly, for example via an interposed electron blocking layer. The active region can bear on the core either directly or indirectly, for example via an interposed quantum barrier.

The LEDs according to the present invention are preferably based on III-V materials, particularly based on GaN. The different parts and regions of the LED typically have a hexagonal crystallographic structure. According to the Miller-Bravais system, (hkil) will be used to annotate a plane of the hexagonal structure, {hkil} a family of planes of the hexagonal structure, [hkil] a direction or a vector of the hexagonal structure.

The external quantum efficiency EQE can be broken down into three components:
 the injection efficiency (IE) of the carriers in the active region,
 the internal quantum efficiency (IQE) which is the ratio between the number of radiative recombinations and the total number of recombinations,
 the light extraction efficiency (LEE) which corresponds to the proportion of photons coming out of the LED relative to the number of photons generated.

The term "3D structure" is understood as distinct from so-called planar or 2D structures, which have two dimensions in a plane that are substantially greater than the third dimension normal to the plane. Thus, the usual 3D structures targeted in the field of 3D LEDs can be in wire, nanowire or microwire, or pyramidal form. Such a 3D structure has an elongated shape or is oriented along the longitudinal direction z. The longitudinal dimension of the wire, along z in the figures, is greater, and preferably substantially greater, than the transverse dimensions of the wire, in the plane xy in the figures. The longitudinal dimension, and particularly for a wire, is for example substantially between at least two times, and at least ten times, greater than the transverse dimensions, preferably between three times and five times the transverse dimensions. In the example of pyramids, the ratios of longitudinal dimensions to transverse dimensions can be fixed. This typically depends on the geometries of the GaN crystals. For example, for a pyramid, the ratio of the longitudinal dimension to a transverse dimension is substantially less than or equal to 0.9.

3D structures can also be in the form of walls. In this case, only one transverse dimension of the wall is substantially less than the other dimensions, for example three to five times less than the other dimensions. The 3D structures of the present application preferably have substantially vertical or oblique walls or edges in the case of a pyramidal shape. The vertical walls typically extend along m type {10-10}crystallographic planes. They can be involved in a so-called radial growth mechanism. The 3D structures of the present application, and particularly structures in wire form, preferably have bases and vertices comprising substantially horizontal surfaces. These horizontal surfaces typically extend along c (0001) or −c (000-1) type crytallographic planes. They can be involved in a so-called axial growth mechanism. According to one possibility, the 3D structures are in the form of pyramids or nanopyramids. According to another possibility, the 3D structures are in the form of "elongated" pyramids or in "pencil" form, typically a nanowire topped by a pyramid.

"Axial growth" means anisotropic growth occurring essentially or only along the longitudinal direction z. "Radial growth" means isotropic growth covering particularly the surfaces parallel to the longitudinal direction z.

The steps of the method as claimed should be understood in the broad sense and can optionally be implemented in several sub-steps.

A substrate, a layer or a device, "based on" a material M is taken to mean a substrate, a layer or a device comprising only this material M or this material M and optionally other materials, for example alloying elements, impurities or doping elements.

Hereinafter, the following abbreviations relating to a material M are optionally used:
 a-M refers to the material M in amorphous form, according to the terminology normally used in the microelectronic field for the prefix a−.
 p-M refers to the material M in polycrystalline form, according to the terminology normally used in the microelectronic field for the prefix p−.

Similarly, the following abbreviations relating to a material M are optionally used:
 M-i refers to the intrinsic or unintentionally doped material M, according to the terminology normally used in the microelectronic field for the suffix −i.
 M-n refers to the N, N+ or N++ doped material M, according to the terminology normally used in the microelectronic field for the suffix −n.
 M-p refers to the P, P or P++ doped material M, according to the terminology normally used in the microelectronic field for the suffix −p.

A reference frame, preferably orthonormal, comprising the axes x, y, z is shown in the figures.

The axis z is here parallel to the axis c, i.e. to the crystallographic direction [0001].

In the present patent application, thickness will preferentially be spoken of for a layer and height for a structure or a device. The thickness is considered along a direction normal to the main extension plane of the layer, and the height is considered perpendicularly to the base plane xy of the substrate. Thus, a layer typically has a thickness along z, when it extends mainly along a plane xy, and an LED has a height along z. The relative terms "on", "above", "under", "subjacent" refer to positions taken along the direction z.

The dimensional values should be understood considering the manufacturing and measurement tolerances. The terms "substantially", "about", "of the order of" mean, when they relate to a value, "to within 10%" of this value or, when they relate to an angular orientation, "to within 10°" of this orientation. Thus, a direction substantially normal or perpendicular to a plane means a direction having an angle of 90±10° with respect to the plane.

To determine the geometry of the 3D structures and the compositions of the various elements (wire, active region, deceleration layer) of these 3D structures, scanning electron microscopy (SEM) or transmission electronic microscopy (TEM) or scanning transmission electron microscopy (STEM) analyses can be carried out.

TEM or STEM lend themselves particularly well to observing and identifying quantum wells—the thickness of which is generally of the order of a few nanometers—in the active region. Various techniques listed below non-exhaustively can be implemented: dark field and bright field imaging, weak beam imaging, high angle annular dark field (HAADF) imaging.

The chemical compositions of the various elements can be determined by means of the well-known EDX or X-EDS method, which means "energy dispersive x-ray spectroscopy".

This method is well adapted to analyzing the composition of small-sized optoelectronic devices such as 3D LEDs. It can be implemented on metallurgical sections in a scanning electron microscope (SEM) or on thin plates in a transmission electron microscope (TEM).

The techniques mentioned above particularly make it possible to determine whether an optoelectronic device with a 3D structure comprises a magnetic layer within the meaning of the present invention, and/or a masking layer indicating an implementation of localized growth, as described in the present invention.

Figure 2:
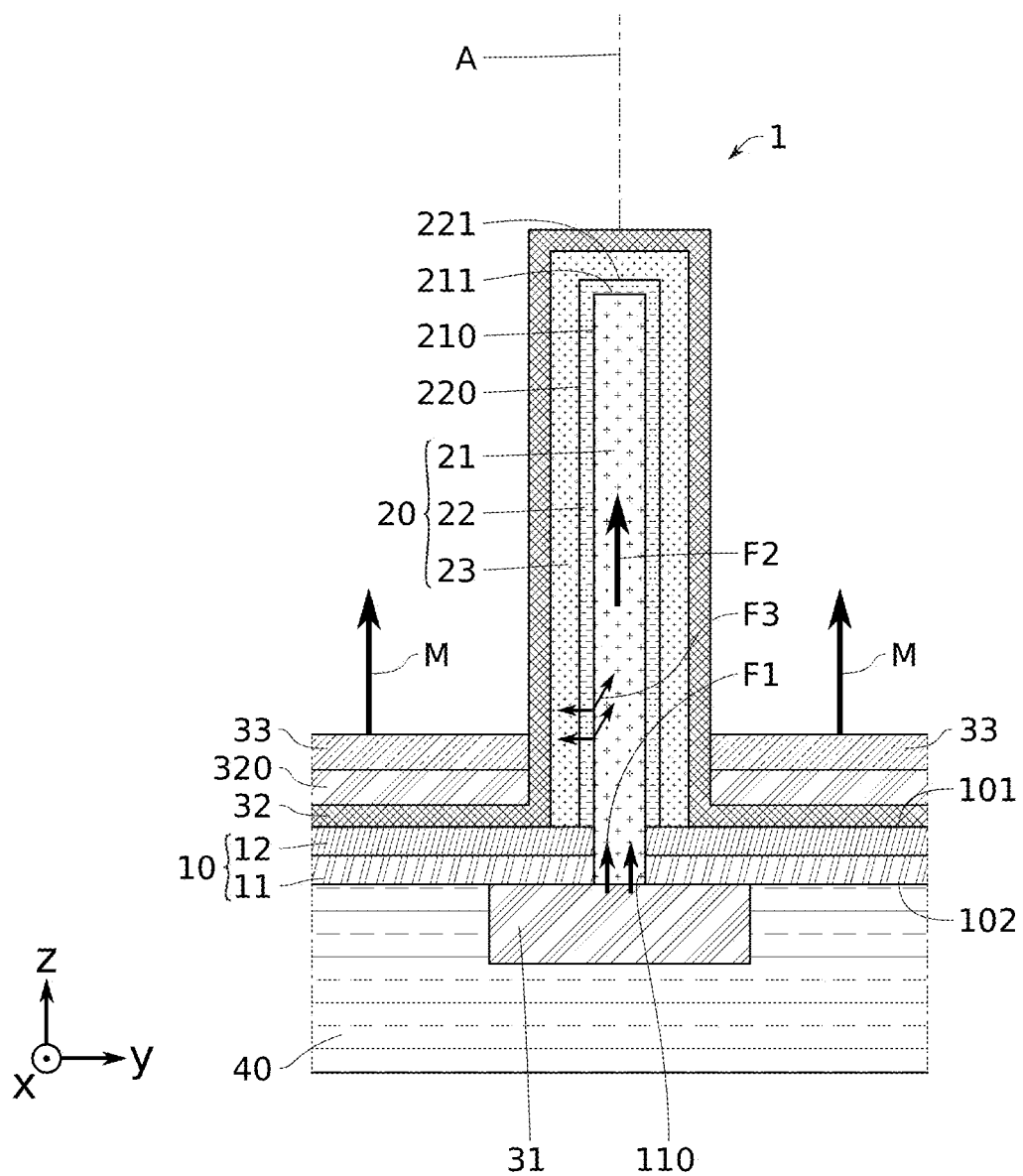
FIG. 2 illustrates a radial 3D LED in wire form comprising a magnetic layer, according to another exemplary embodiment of the present invention.

FIGS. 1 and 2 illustrate an LED 1 comprising a 3D structure 20 in nanowire form, according to two particular exemplary embodiments of the invention. The 3D structure 20 of the LED has a radial architecture also referred to as core-shell. Such a radial architecture can particularly comprise, from the inside to the outside of the nanowire along the direction y:

a first part 21, or equivalently a core 21, having a diameter between 50 nm and 1.2 μm, typically of the order of 700 nm. This first part 21 forms the core of the nanowire. It is preferably composed of GaN-n, an active region 22 with a thickness between 20 nm and 250 nm, typically of the order of 40 nm. The active region 22 covers the edges 210 and the vertex 211 of the core 21, respectively by a radial part 220 and a vertex part 221. It is preferably composed of InGaN. The active region 22 preferably comprises InGaN-i quantum wells alternating with GaN-i quantum barriers. The quantum wells can have a thickness between 1 nm and 15 nm and the quantum barriers can have a thickness between 3 nm and 20 nm, optionally only, and not shown in the figures, an electron blocking layer (EBL) with a thickness between 10 nm and 100 nm, typically 30 nm. The EBL layer is preferably composed of AlGaN. The EBL preferably covers the radial part 220 and the vertex part 221 of the active region 22, a second part 23, or equivalently a shell 23, with a thickness between 50 nm and 500 nm, typically of the order of 250 nm. The shell 23 covers the radial part 220 and the vertex part 221 of the active region 22. It is preferably composed of GaN-p. The shell 23 can directly cover the radial part 220 and the vertex part 221 of the active region 22, or cover the EBL when an EBL is present.

Figure 3:
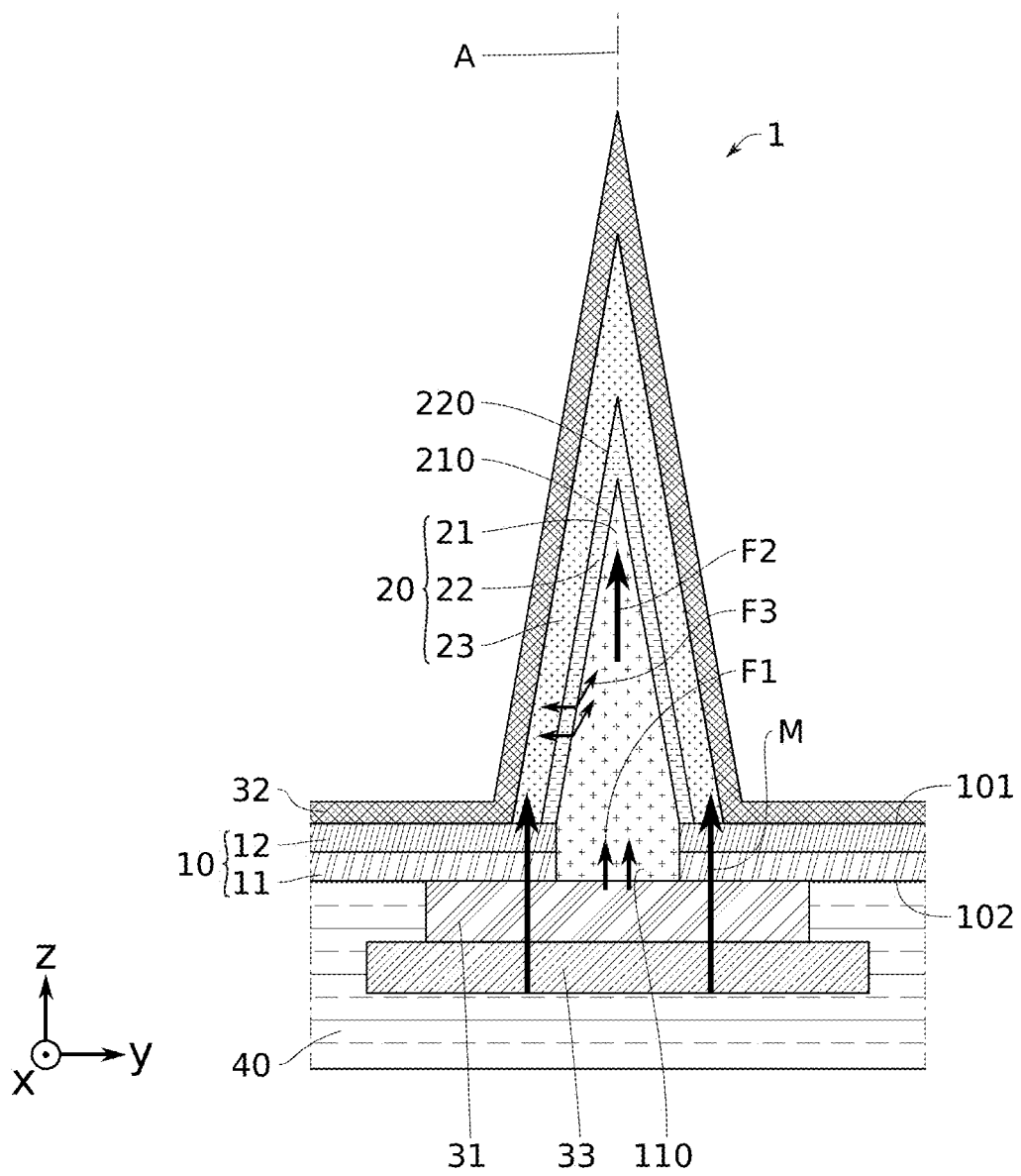
FIG. 3 illustrates a radial 3D LED in pyramidal form comprising a magnetic layer, according to an exemplary embodiment of the present invention.

FIG. 3 illustrates an LED 1 comprising a 3D structure 20 in pyramidal form, according to another particular exemplary embodiment of the invention. According to this example, the core 21 has a pyramidal shape having oblique edges 210 with respect to the direction z. The active region 22 covers the edges 210 of the core 21 with a radial part 220. The shell 23 covers the radial part 220 of the active region 22.

Hereinafter, but not by way of limitation, the 3D structure 20 is considered to be in nanowire form. The features detailed hereinafter, unless incompatible, can equally apply to a pyramidal shape of the 3D structure 20.

Figure 5:
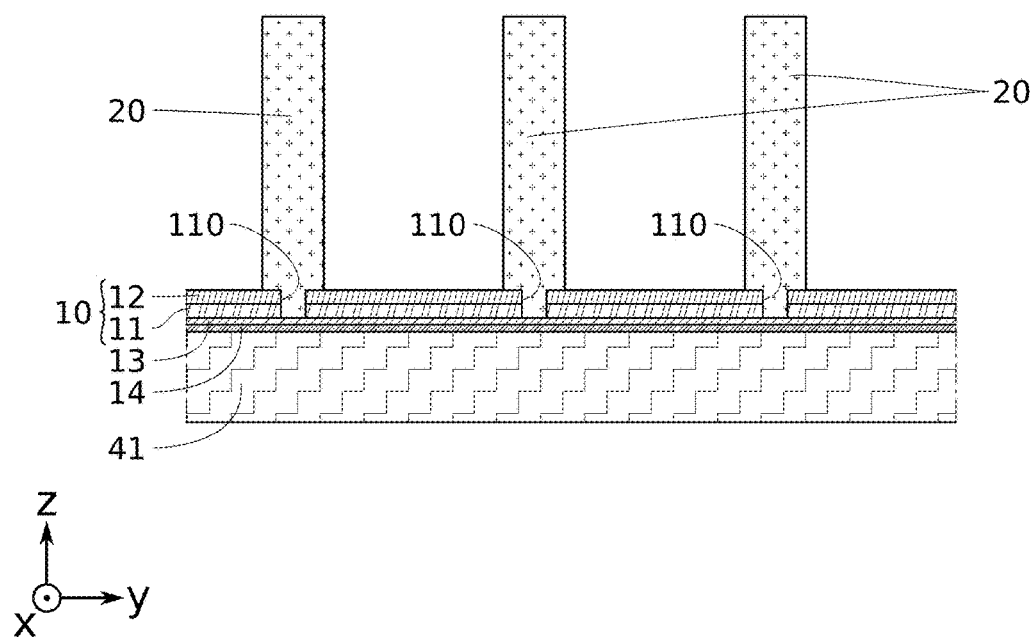

The LED typically comprises a masking layer 10 implemented during the nanowire growth process. This masking layer 10 can comprise several sublayers, for example a layer 11 based on or made of silicon nitride and a layer 12 based on or made of oxide. The masking layer 10 comprises openings 110 configured to promote local growth of the nanowires, as also illustrated in FIG. 5. During growth, the core 21 typically passes through the masking layer 10 at an opening 110, then extends essentially along z. According to one possibility, the cross-section in the plane xy of the core 21 suddenly increases at the exit of the opening 110. The core 21 can thus bear on the top face 101 of the masking layer 10.

The LED can further comprise a first electrically conducting contact 31, configured to inject charge carriers into the core 21, as illustrated by the arrows F1 in FIGS. 1 to 3. In the example illustrated, the charge carriers injected by the first contact 31 are electrons. The first contact 31 can be metallic, for example based on aluminum. Advantageously, this first contact 31 can also be used as an optical reflector, to reflect the light emitted by the active region 22 on the vertex side of the nanowire (i.e. on the "front face" side of the device). This makes it possible to enhance the light extraction efficiency of the LED. The first contact 31 is typically electrically insulated by a dielectric layer 40, for example based on silicon oxide, located on the bottom face 102 of the masking layer 10 around the first contact 31.

The LED can further comprise a second electrically conducting contact 32, configured to inject charge carriers into the shell 23. In the example illustrated, the charge carriers injected by the second contact 32 are holes. The second contact 32 is typically transparent at the wavelength of the light emitted by the active region 22. The second contact 32 is for example based on transparent conducting oxide (TCO), for example based on ITO (indium tin oxide).

According to a principle of the present invention, the 3D LED advantageously comprises a magnetic layer 33 configured to have a polarization M, as illustrated in FIGS. 1 to 3. This polarization is oriented substantially parallel with the direction z. Thus, it is understood that the polarization M is oriented along a main direction non-perpendicular, and for example substantially parallel or oblique (and therefore more particularly forming a non-right angle, for example comprised between 0° and 90°, excluding 90°) to the radial part 220 of the active region 22. The magnetic field generated thus disrupts the trajectory of the electrons. The electrons are propagated along the arrow F2 in the core 21. At the p/n junction in the radial part 220 of the active region 22, their trajectory is disrupted by the magnetic field generated, as illustrated by the arrows F3, which decelerates the electrons at the edges 210 of the core 21 and at the radial part 220 of the active region 22. As their residence time is increased, electron-hole pair recombination is promoted at a plane m, thus promoting radiative recombination.

The magnetic layer 33 preferably has a polarization of intensity between 0.1 T and 1.5 T, preferably substantially equal to 0.5 T. The 3D structure 20 can have a height along z between 100 nm and 5 μm. The 3D structure 20 can have at least one dimension in the plane xy between 300 nm and 3 μm. The polarization ranges described are indeed advantageously adapted to generate a magnetic field impacting the trajectory of the electrons in a satisfactory manner during propagation in the core 21. The polarization of the magnetic layer 33 can be permanent. It can be provided that the polarization in the magnetic layer 33 is induced by an additional magnetic source.

The electrons being disrupted remotely by the magnetic field, it is possible to dispose this magnetic layer 33 at different locations with respect to the 3D structure 20. An electrical contact particularly between the magnetic layer and the electrical contacts 31, 32 is not necessary. The relative orientation of the magnetic layer 33, and therefore its polarization M, with respect to the radial part 220 of the active region 22 mainly contributes to this effect rather than its position relative to the 3D structure. Two non-limiting examples are described below. Other configurations can be envisaged.

According to a first particular example, illustrated in FIGS. 1 and 3, the magnetic layer 33 is subjacent, along the direction z, to the 3D structure 20, and particularly to the first contact 31. The magnetic layer 33 can be in direct electrical contact with the first contact 31 or via a separate layer of this first contact 31, for example via an electrically insulating layer 40 described hereinafter.

According to a second particular alternative or combinable example with the previous one, and illustrated in FIG. 2, the magnetic layer 33 is above the top face, along the direction z, of the masking layer 10. The magnetic layer 33 can for example be above the second contact 32. Here again, the magnetic layer 33 can be in direct electrical contact with the second contact 32 or via a separate layer from this second contact 32, for example via an electrically insulating layer 61 described hereinafter.

Preferably, the magnetic layer 33 is discontinuous. As illustrated for example by FIGS. 4A to 4C, the magnetic layer can therefore comprise portions 332 based on or made of a magnetic material, and portions 331 devoid of magnetic material (e.g. based on or made of a non-magnetic material, such as a dielectric). These discontinuities allow the generation of local magnetic field maxima. The portions 331 and 332 together preferably form a pattern repeated at regular intervals in one and preferably two directions of the main extension plane xy of the magnetic layer 33. These local maxima are thus evenly distributed in the magnetic layer 33.

Figure 4A:
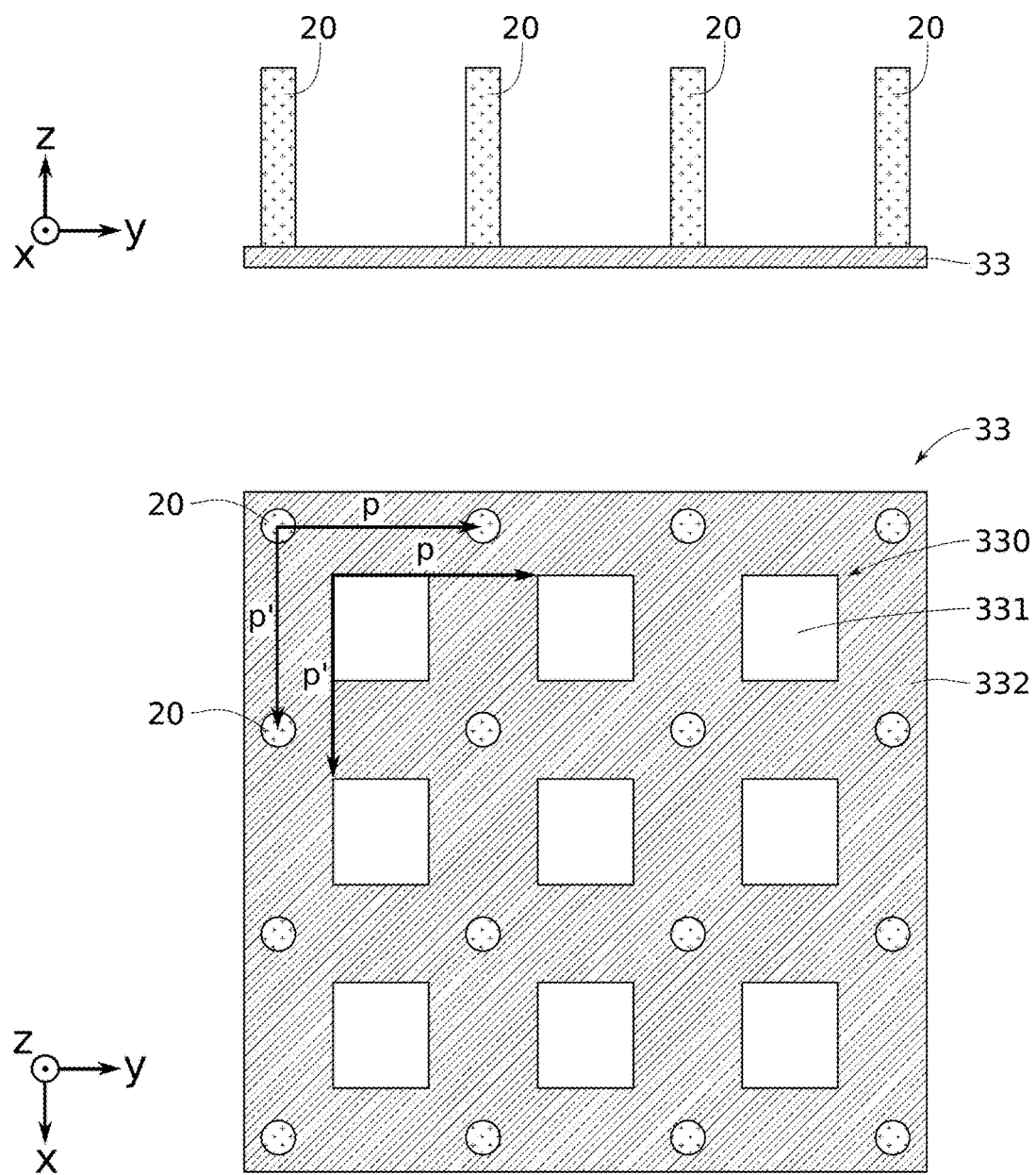
FIGS. 4A to 4C illustrate different arrangements of patterns of the magnetic layer with several 3D structures, according to several exemplary embodiments.
Figure 4B:
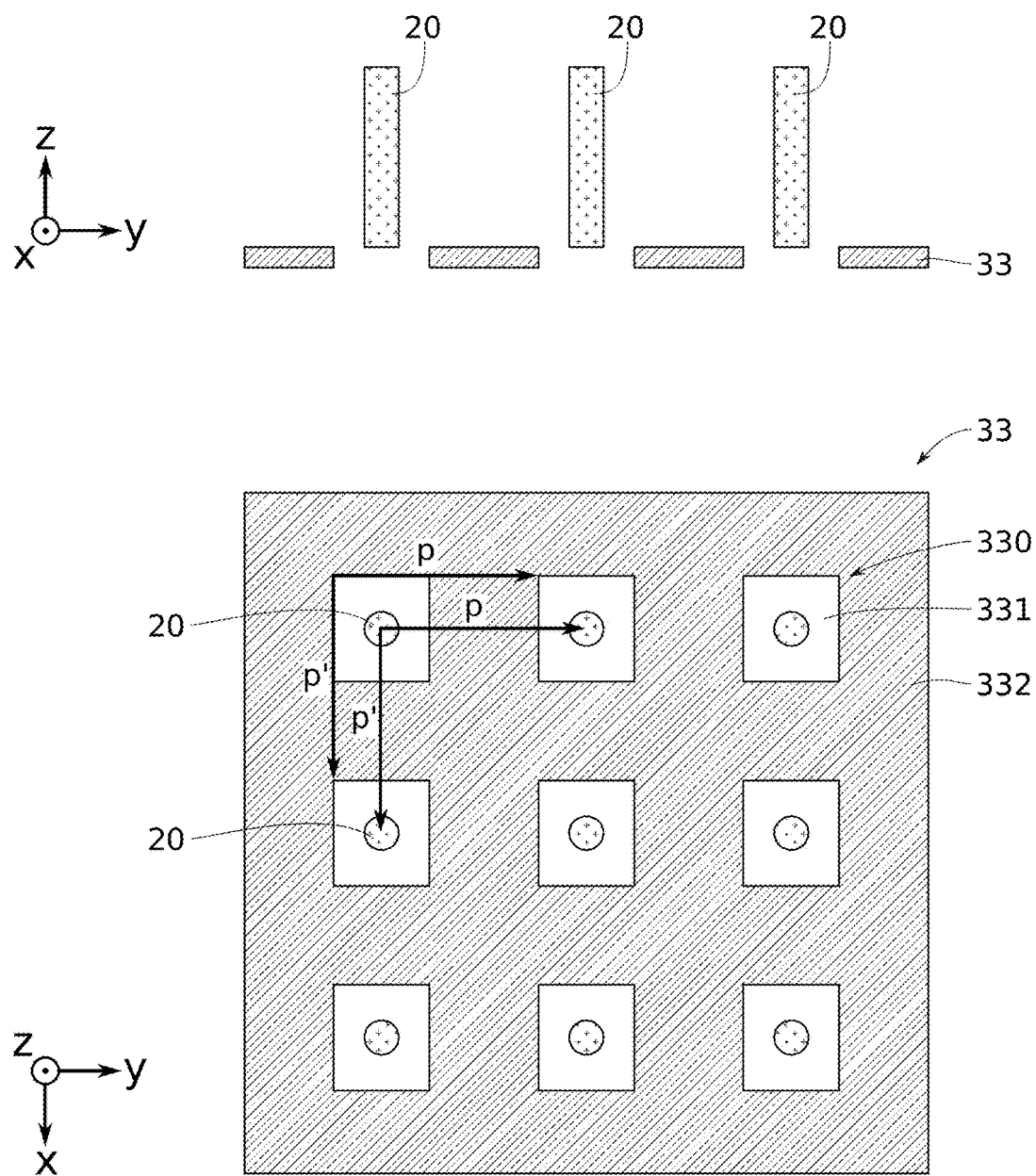

As illustrated in FIGS. 4A and 4B for example, the magnetic layer 33 comprises a magnetic portion 332 wherein non-magnetic cavities or pads 331 are produced. These cavities or pads form patterns 330 spaced according to a first lattice by pitches p and p' respectively in the directions y and x. p and p' are preferably but not necessarily substantially equal.

Figure 4C:
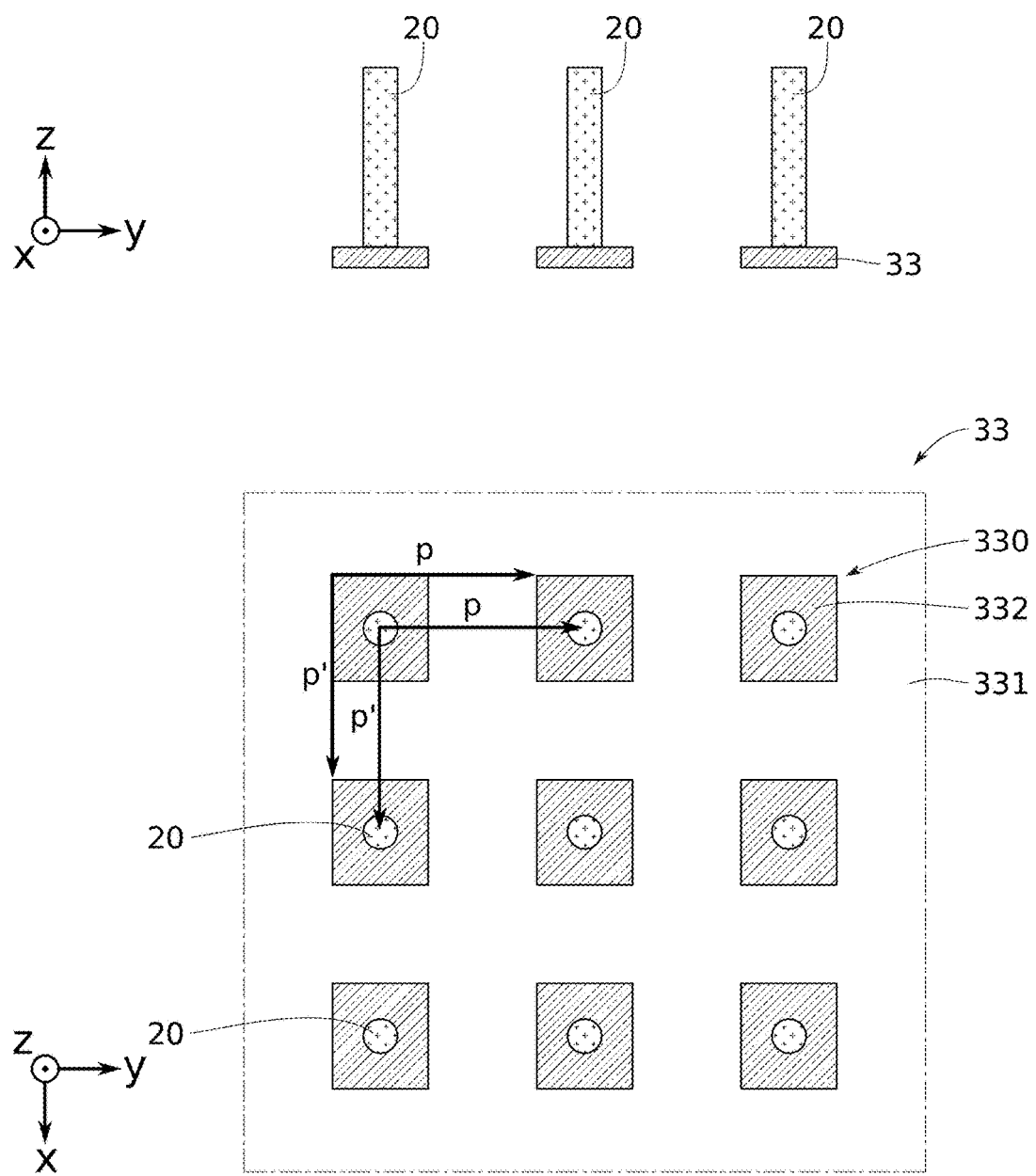

As illustrated in FIG. 4C, the patterns 330 can be formed positively from magnetic material. Thus, pads 332 of magnetic materials can be distributed in the first lattice according to the pitches p and p'. Each pad 332 can be surrounded by a portion 331 devoid of magnetic material.

Note that any shape, for example circular or polygonal, can be envisaged for the patterns 330. The patterns 330 are not necessarily distributed in both directions x and y, although this is preferred. The patterns 330 can for example be grooves spaced by a pitch p along the direction y.

Preferably, the 3D structures 20 are disposed coincident with the patterns 330, so as to place the 3D structures 20 at the local magnetic field maxima. For this, the 3D structures 20 can be distributed in a second lattice according to the same pitches p, p' as the patterns 330 of the magnetic layer 33. It should be noted that each 3D structure can be placed in a portion based on magnetic material 332 or in a portion devoid of magnetic material 331, as illustrated in FIGS. 4A, 4C and FIG. 4B respectively.

FIGS. 5 to 18B illustrate different steps of a method for producing a 3D structure LED 20 comprising a magnetic layer 33 as described above, according to several particular exemplary embodiments.

Hereinafter, the 3D structures 20 are, by way of non-limiting example, in nanowire form. The internal architecture of these radial 3D structures 20 is not detailed relative to the manufacturing method. A person skilled in the art knows how to adapt the method for obtaining pyramidal 3D structures.

As illustrated in FIG. 5, the nanowires 20 are firstly formed on a growth substrate 41. The substrate 41 can be based on silicon and act as a support. The substrate 41 typically bears one or more layers 13, 14 based on or made of III-V materials or metal nitrides, and particularly refractory metal nitrides. According to alternative examples, these layers 13 and 14 can be continuous (as illustrated) or etched and therefore discontinuous (not illustrated in the figures). A superficial layer 13, referred to as nucleation layer, allows growth of the nanowires 20. The nucleation layer 13 is preferably based on AlN. Alternatively, it can be based on other metal nitrides, for example GaN or AlGaN. It can be formed on the silicon support 41 by epitaxy, preferably by metalorganic-vapor phase epitaxy (MOVPE). It advantageously has a thickness less than or equal to 200 nm, preferably less than or equal to 100 nm, for example of the order of 50 nm.

A masking layer 10 is preferably formed on the nucleation layer 13. It can comprise a plurality of sublayers based on dielectric material, for example made of silicon nitride $Si_3N_4$ nitride and/or silicon oxide. The masking layer 10 can be formed by chemical vapor deposition (CVD). It partially masks the nucleation layer 13 and comprises preferably circular openings 110 exposing areas of the nucleation layer 13. These openings 110 typically have at least one dimension, for example a diameter, between 30 nm and 500 nm. The openings 110 can be evenly distributed within the masking layer 10, for example in the form of an organized lattice.

Such a masking layer 10 allows localized growth of a 3D structure 20 at each opening 110. In particular, during a preliminary growth step referred to as germination, a seed based on GaN forms at the opening 110 then fills the opening 110. Subsequent growth of the nanowire 20 then occurs from this seed, locally.

During the formation of the nanowires 20, the cores 21, the active regions 22 and the shells 23, are successively formed by epitaxy, preferably by metalorganic-vapor phase epitaxy MOVPE. The nanowires 20 typically have a characteristic diameter or dimension in the plane xy between 200 nm and 2 μm. The nanowires 20 preferably have a substantially horizontal vertex, formed by a polar plane c (0001) or −c(000-1). They have substantially vertical edges, formed by non-polar planes m {10-10}.

Figure 6:
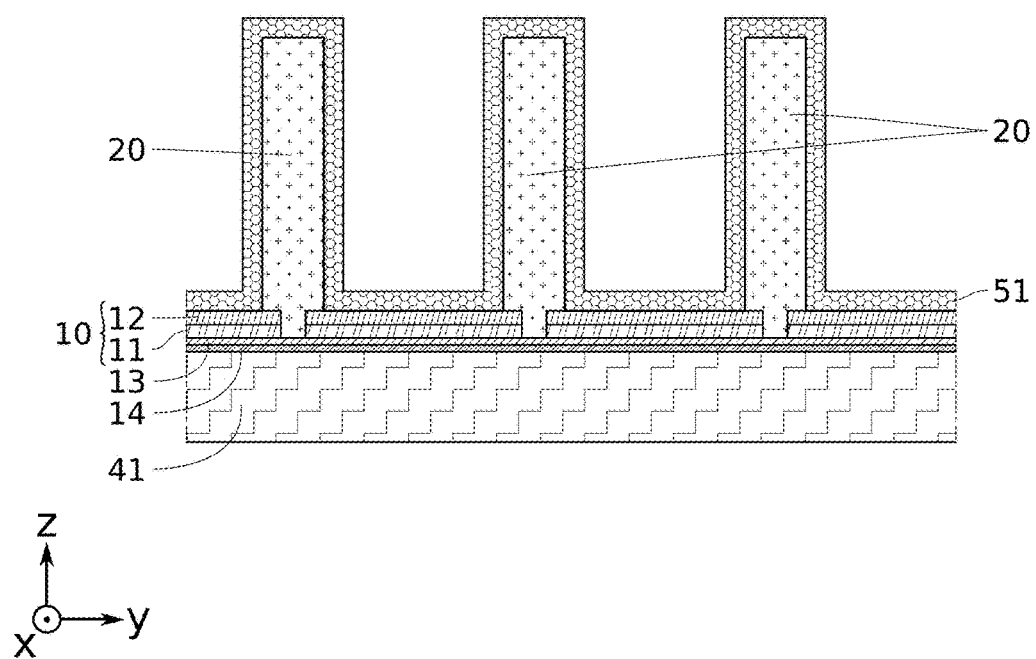
Figure 7:
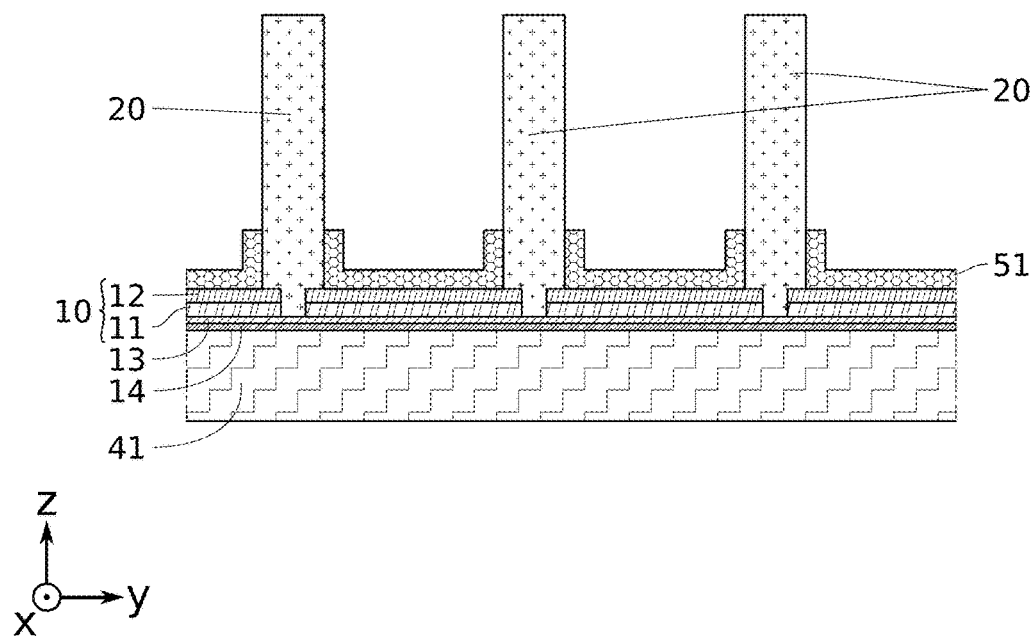

As illustrated in FIG. 6, after formation of the nanowires 20 by localized growth through the masking layer 10, a dielectric layer 51 is deposited in a conformal manner on the nanowires 20 and on the exposed parts of the masking layer 10. The dielectric layer 51 is for example based on silicon oxide $SiO_2$. It can be formed by plasma-enhanced chemical vapor deposition (PECVD). As illustrated in FIG. 7, the dielectric layer 51 is then partially etched, so as to expose the vertices and edges of the nanowires 20 along almost all of their height. The etching typically corresponds to isotropic wet etching. After etching, the dielectric layer 51 is retained on the masking layer 10. It preferably forms a ring at the base of the nanowires 20. It makes it possible to reinforce the electrical insulation provided in part by the masking layer 10.

Figure 8:
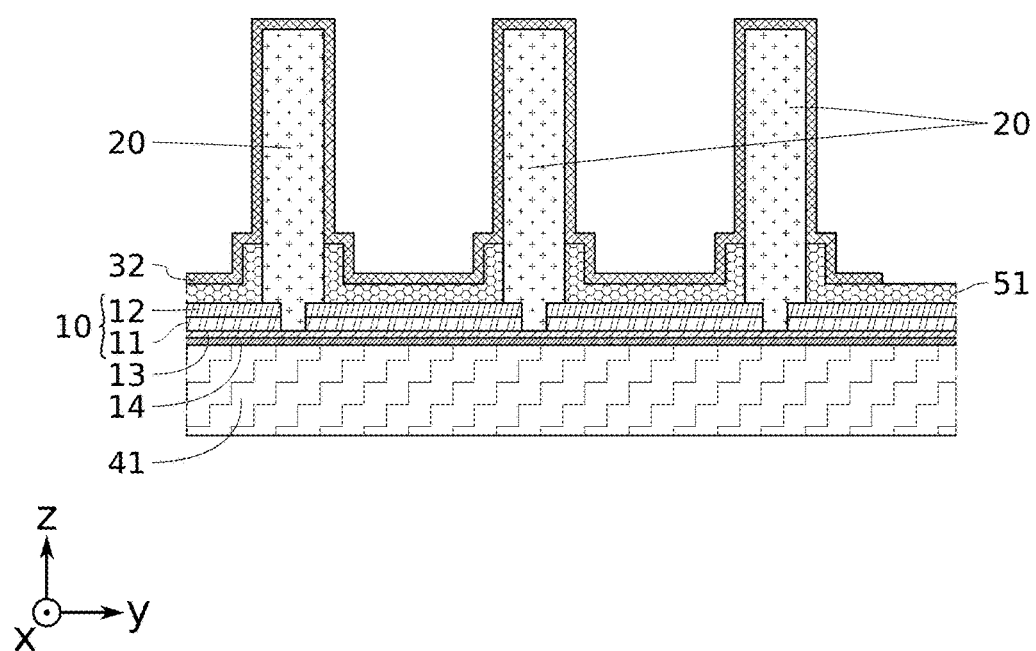

As illustrated in FIG. 8, a layer based on a transparent electrically conducting material is deposited continuously on and between the nanowires 20. This continuous layer here completely covers the exposed vertices and edges of the nanowires 20. It makes it possible to form the second electrical contact 32. It is typically based on a transparent conducting oxide, for example based on ITO or ZnO. High-temperature annealing can be performed so as to obtain an ohmic contact between the second electrical contact 32 and the shell 23 of each nanowire 20.

Figure 9:
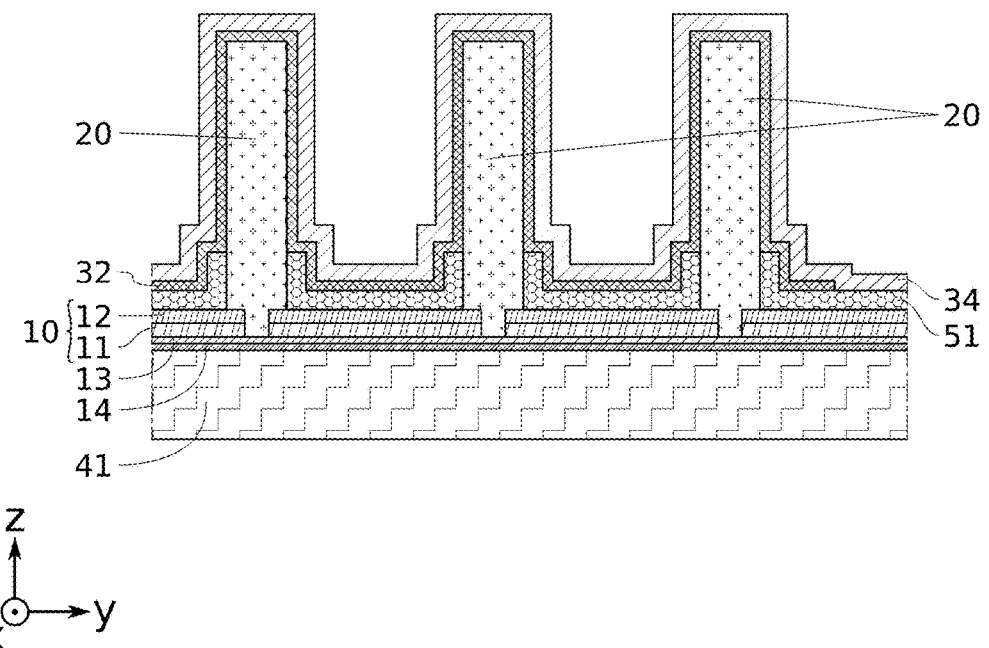

As illustrated in FIG. 9, a metal layer 34 is then deposited on the continuous layer forming the second electrical contact 32. This metal layer 34 is preferably based on a reflective metal at the wavelengths of the light emitted by the active region 22. It is typically based on aluminum.

Figure 10:
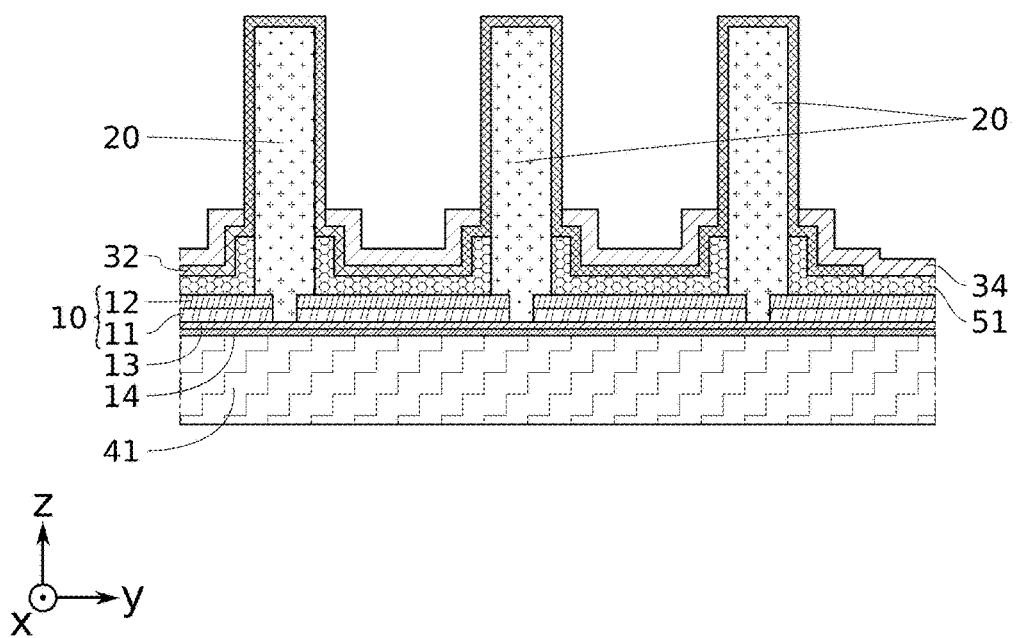

As illustrated in FIG. 10, the metal layer 34 is then etched in part, so as to expose the subjacent continuous layer 32 along almost all of the height of the nanowires 20. The etching typically corresponds to isotropic etching. After etching, the metal layer 34 is retained on the second electrical contact 32 between the nanowires 20. It can form a ring at the base of the nanowires 20. It makes it possible to form a flat electrical supply cable for the second electrical contact 32. It furthermore makes it possible to form a reflector for the light emitted by the active region 22. The light extraction efficiency of the LED is enhanced.

Figure 11:
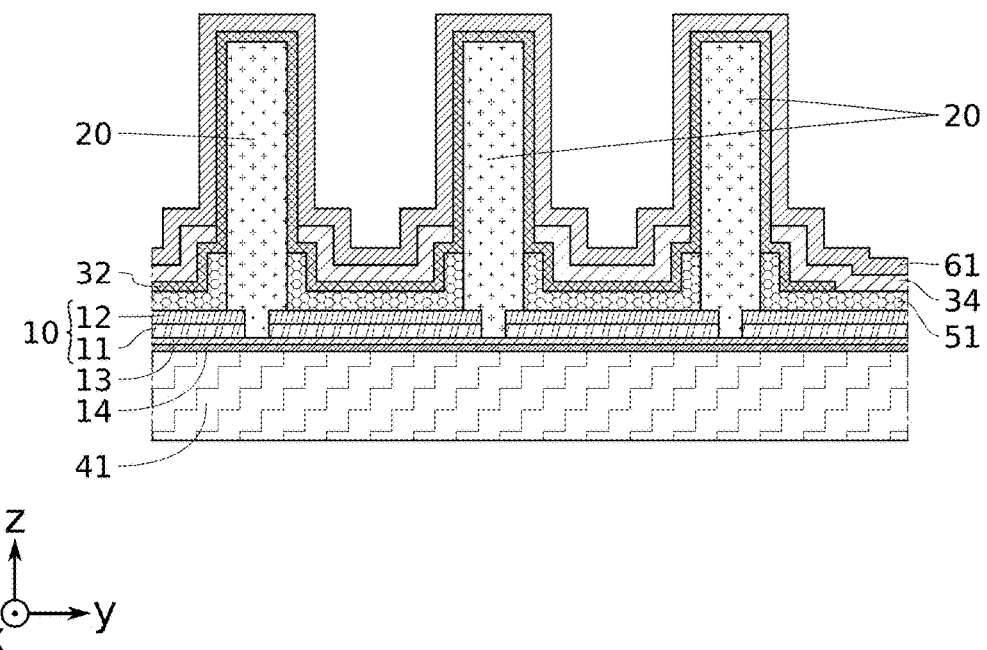

As illustrated in FIG. 11, a passivation layer 61 can then be deposited on the exposed parts of the second electrical contact 32 and on the metal layer 34. This passivation layer 61 is for example based on an aluminum alloy, for example based on $Al_2O_3$. It can be made of a dielectric material. It can be formed by plasma-enhanced chemical vapor phase deposition PECVD.

Figure 12:
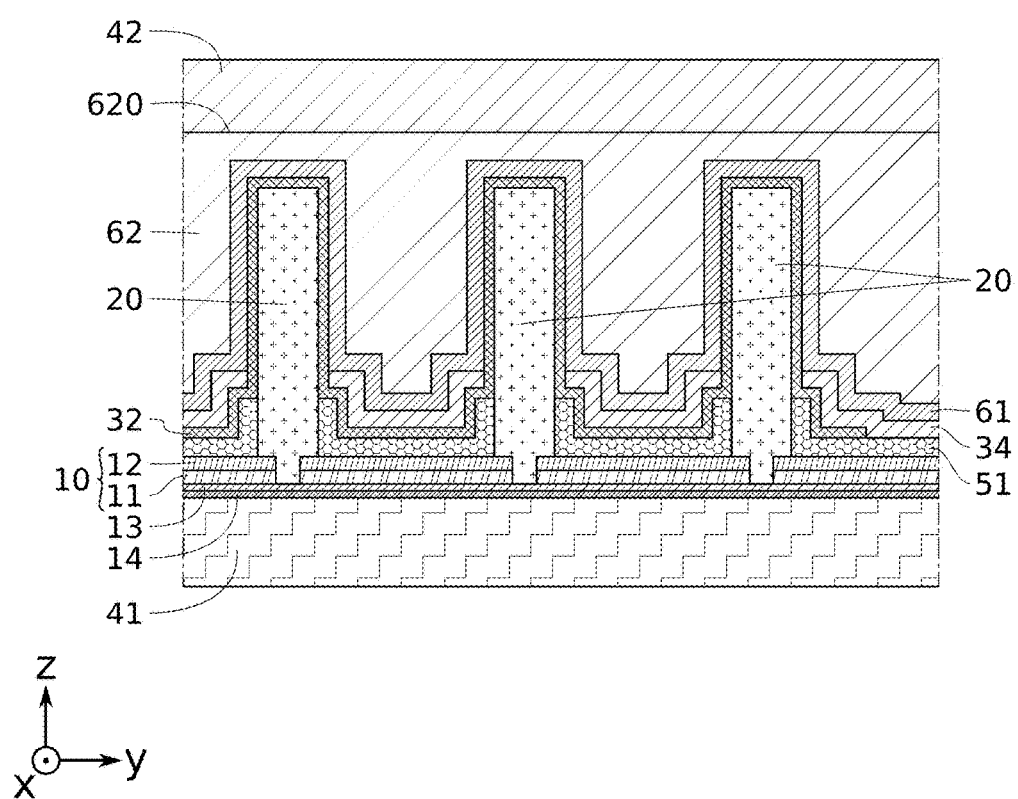

As illustrated in FIG. 12, the nanowires 20 protruding from the substrate 41 are then planarized by a planarization layer 62. This planarization layer 62 is typically deposited between and on the nanowires 20, then polished by chemical mechanical planarization (CMP) in order to obtain a planar surface 620 above the nanowires 20. This planarization layer 62 is typically electrically insulating and transparent.

A handling substrate 42, also referred to as "handle", is then bonded by molecular adhesion on the planar surface 620, on the "front face". This handling substrate 42 can be transparent, for example based on glass. In this case, it can be retained in the final device, at the end of the manufacturing method. Alternatively, the handling substrate 42 is opaque, for example based on silicon. In this case, it is typically removed at the end of the manufacturing method, after performing the steps designated for the "backface" or bottom face of the diode, along the direction Z.

Figure 13:
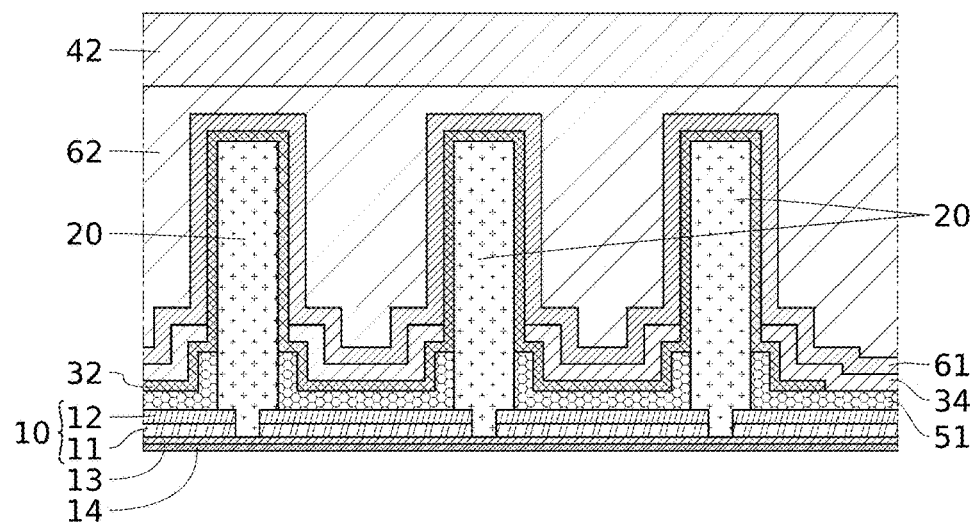

As illustrated in FIG. 13, after bonding the handling substrate 42, the growth substrate 41 can be removed. This removal can be performed in a known manner by a mechanical lapping step followed by a dry etching or wet etching step.

Figure 14:
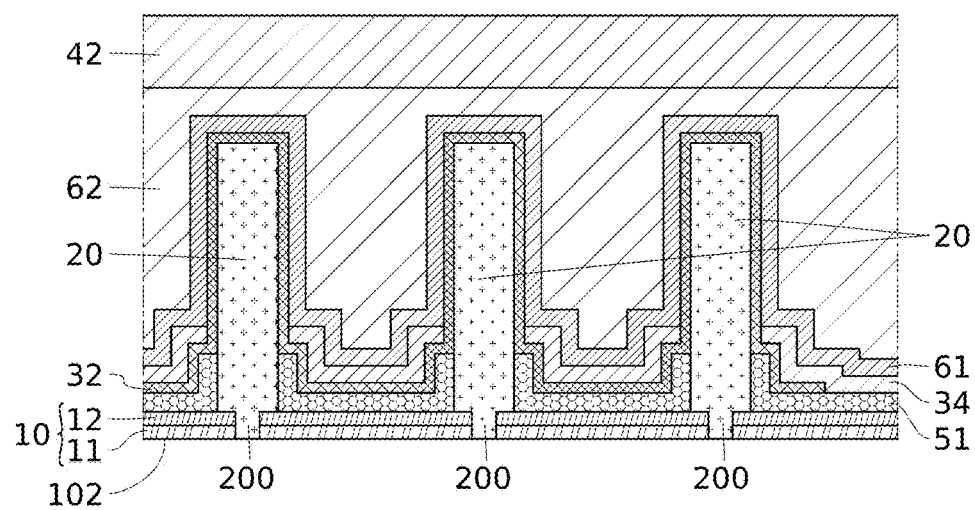

As illustrated in FIG. 14, the layers 13, 14 based on III-V materials or metal nitrides, used previously for germination/nucleation of the nanowires 20, are then removed from the back face, typically by one or more dry etchings. After removing the layers 13, 14, the bottom face 102 of the masking layer 10 is exposed. The portions 200 of nanowires 20 enclosed by the masking layer 10, initially corresponding to the seeds formed during the germination/nucleation steps, are also exposed after removing the layers 13, 14.

Figure 15:
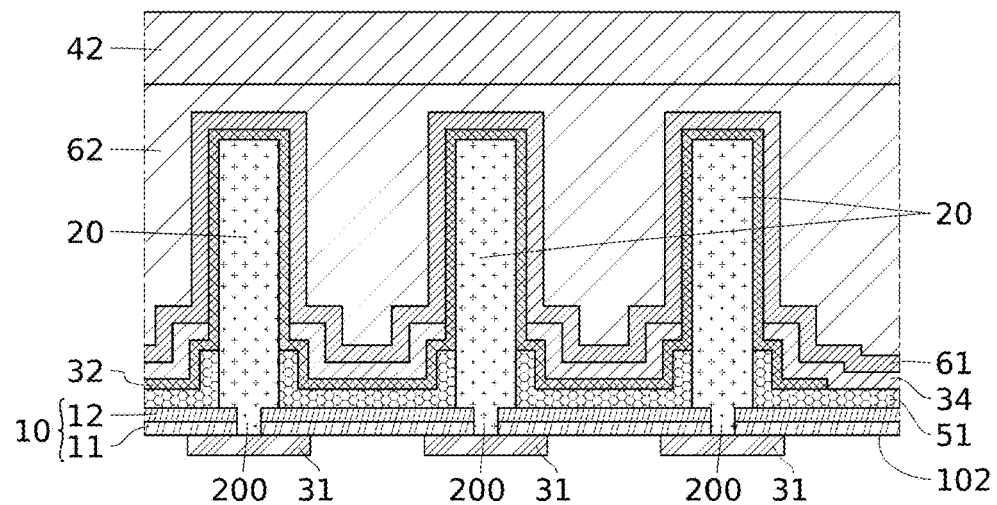

As illustrated in FIG. 15, according to one possibility, the first electrical contacts 31 are formed directly on the portions 200 of nanowires 20. They preferably cover all the free surfaces of the portions 200 and bear on the bottom face 102 of the masking layer 10. The first electrical contacts 31 are preferably metallic, typically based on aluminum. They indirectly provide the electrical power supply of the nanowires 20. The first electrical contacts 31 also form reflectors on the back or bottom face, in order to redirect the light emitted by the nanowires to the front or top face of the diode.

Figure 16A:
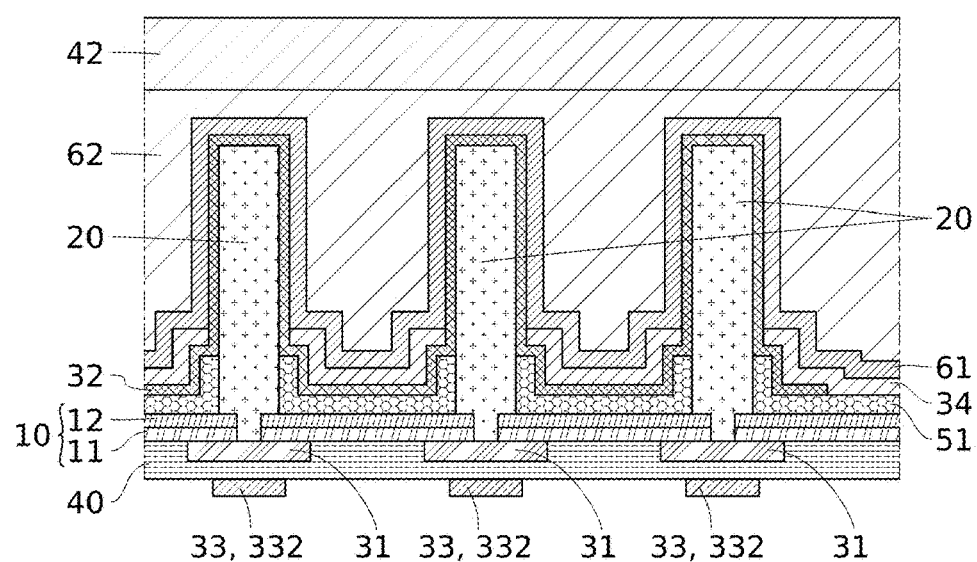

As illustrated in FIG. 16A, an electrically insulating layer 40, for example made of dielectric material, can, according to a first example, be deposited on the back face on the bottom face 102 and on the first electrical contacts 31. This layer is hereinafter referred to as dielectric layer 40. The dielectric layer 40 can be planarized, for example by chemical and/or mechanical polishing, to ensure the quality of the magnetic layer 33 subsequently deposited.

The magnetic layer 33 can be deposited on the back or bottom face, so as to be subjacent to the dielectric layer 40. Regardless of the exemplary embodiment, the deposition of the magnetic layer 33 can advantageously be carried out with various conventional physical or chemical vapor phase deposition techniques, for example by magnetron sputtering, for example by pulse laser deposition (PLD) or by vacuum evaporation (e.g. thermal evaporation or electron beam-enhanced evaporation).

Following the deposition of the dielectric layer 40, and regardless of the exemplary embodiment, the method can comprise structuring the magnetic layer 33, for example by photolithography and/or by etching so as to form the patterns 330 described above.

Figure 16B:
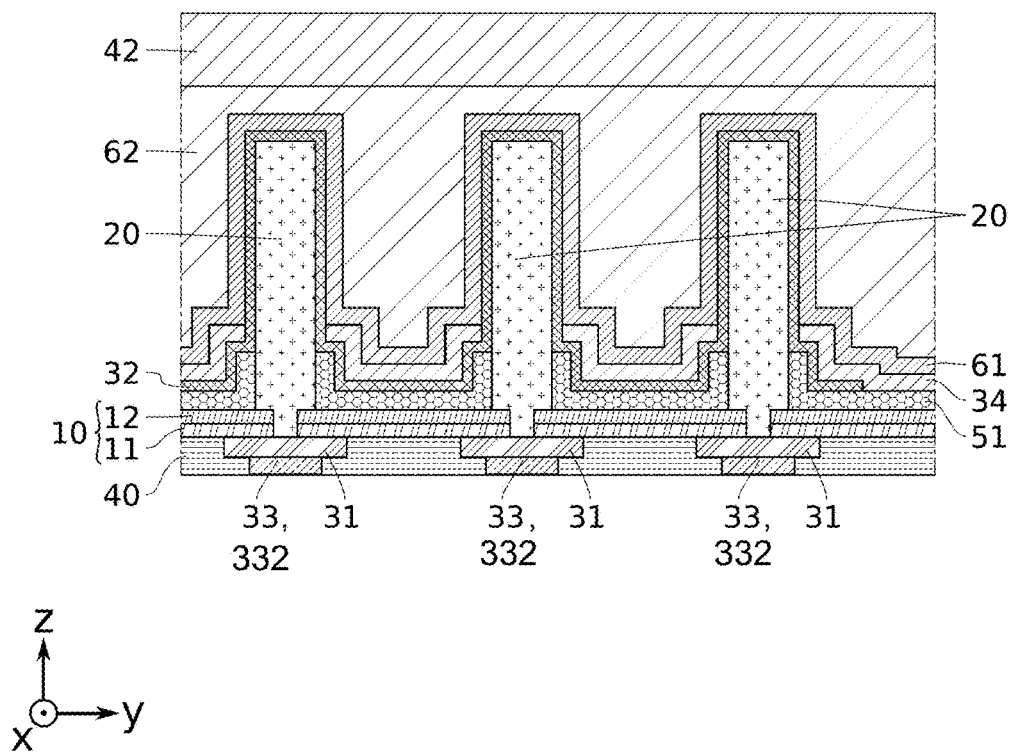
FIGS. 16B to 16D schematically illustrate two alternative embodiments of the magnetic layer on the first contact of the 3D LED, according to an exemplary embodiment of the present invention.

As shown in an alternative embodiment in FIG. 16B, the magnetic layer 33 can be deposited directly on the first electrical contacts 31, prior to the deposition of the dielectric layer 40.

Figure 16C:
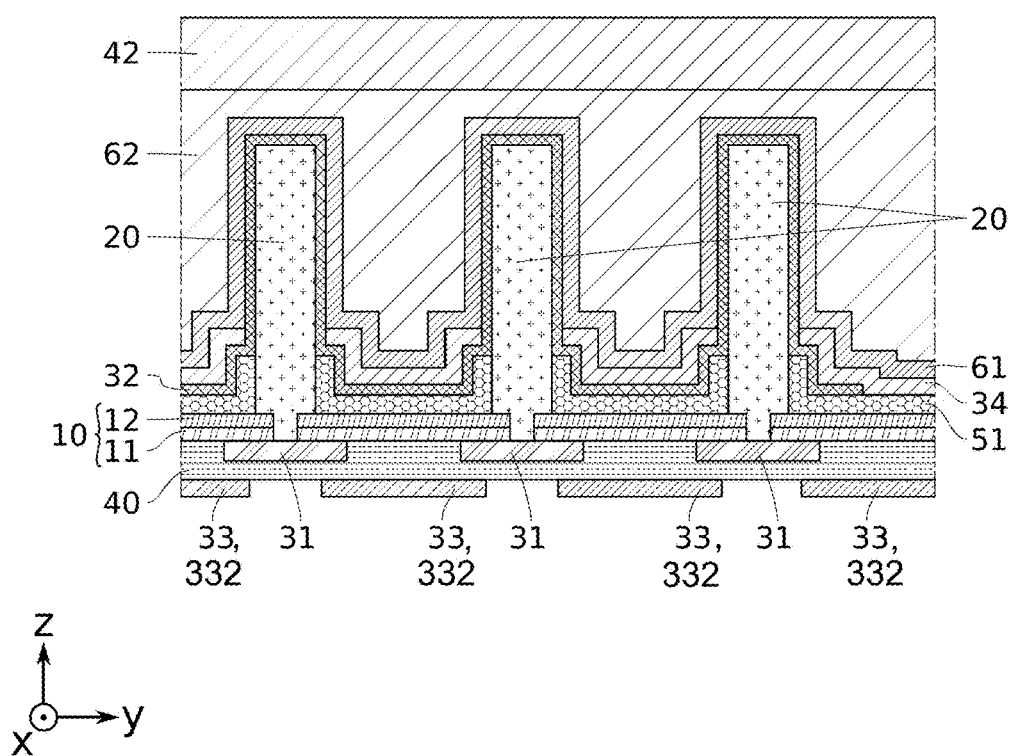

FIGS. 16A and 16B illustrate an exemplary embodiment wherein the portions 332 based on or made of a magnetic material are aligned with each 3D structure 20 along the direction z. Alternatively, and as illustrated in FIG. 16C, the portions 332 based on or made of a magnetic material can be located between the nanowires 20, in projection in a plane xy.

Figure 16D:
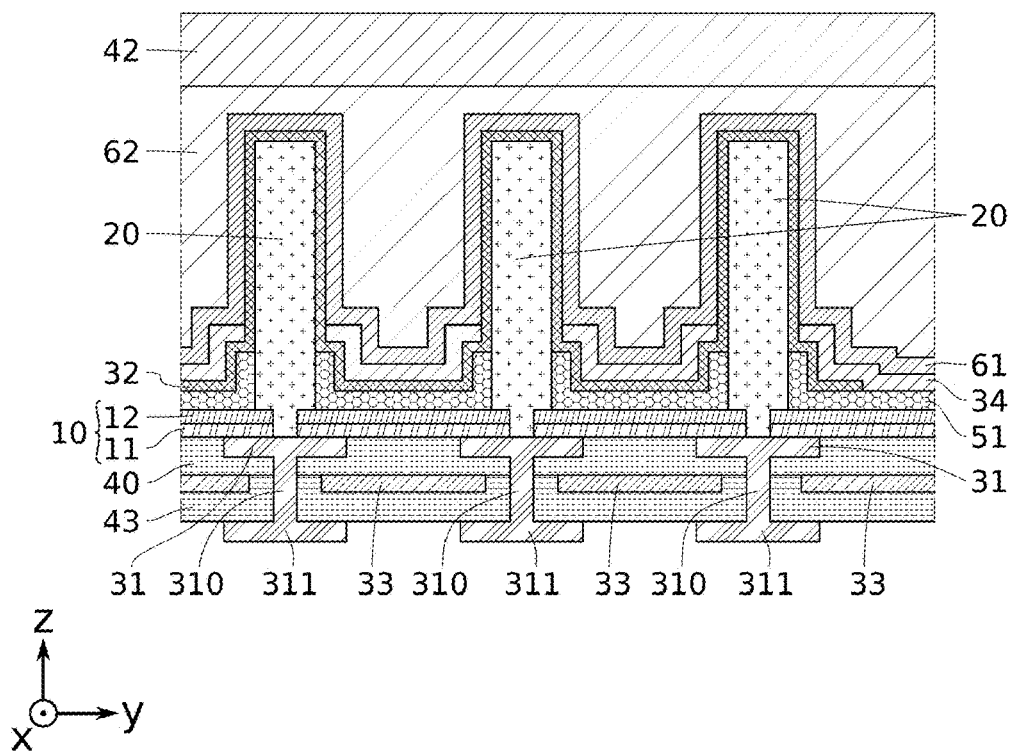

As illustrated in FIG. 16D, according to one possibility, a dielectric layer 43 is deposited on the back face so as to cover the magnetic layer 33. Vias 310 can be formed within the dielectric layer 43, plumb with the first electrical contacts 31. The first secondary electrical contacts 311 are then formed in the form of pads, on the dielectric layer 43, in contact with the previously filled vias 310.

The filling of the vias 310 and the formation of the first secondary electrical contacts 311 can be carried out simultaneously in a single step.

Figure 17A:
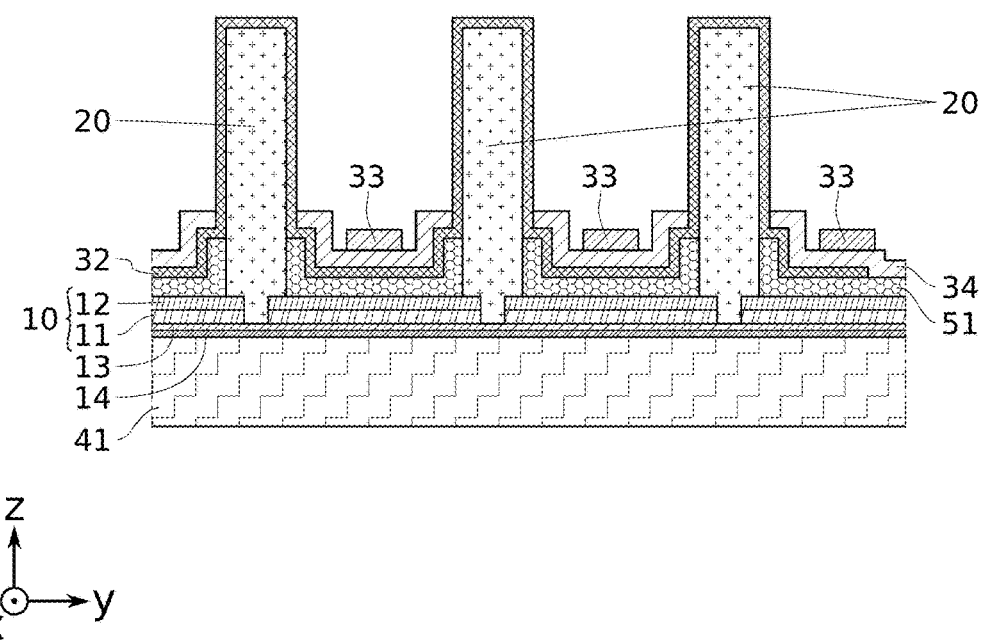
FIGS. 17A and 17B schematically illustrate an alternative embodiment of the magnetic layer on the second contact of the 3D LED, according to an exemplary embodiment of the present invention.
Figure 17B:
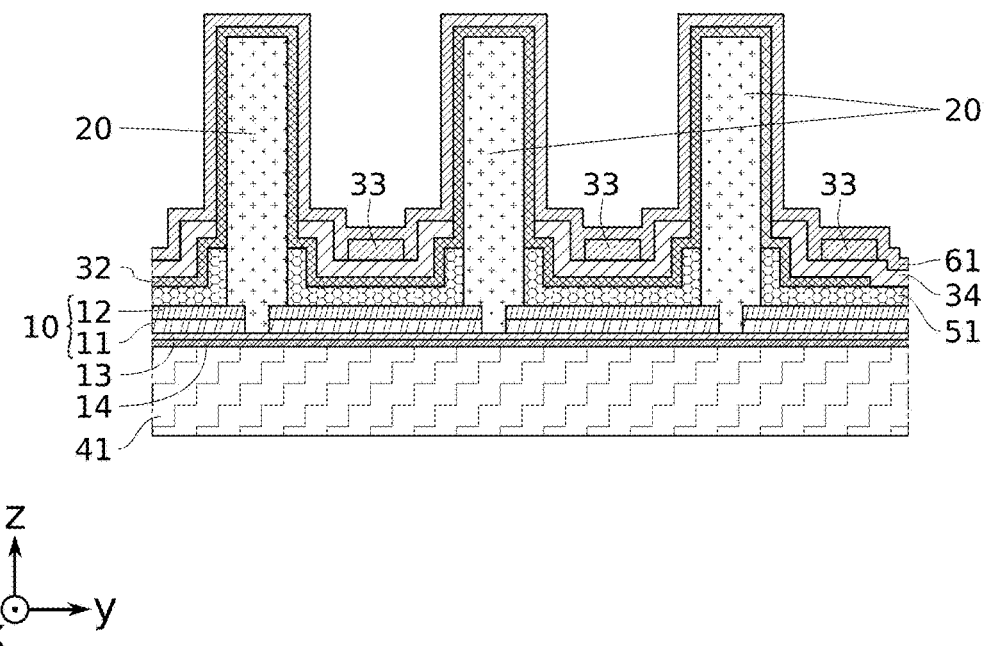
Figure 18A:
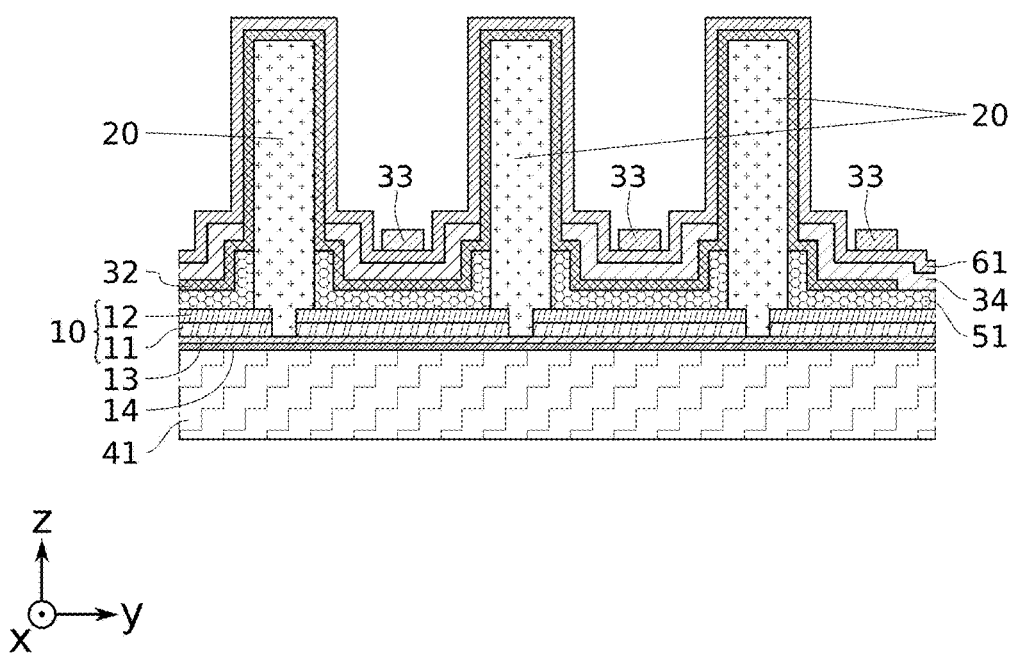
FIGS. 18A and 18B schematically illustrate another alternative embodiment of the magnetic layer on the second contact of the 3D LED, according to an exemplary embodiment of the present invention.
Figure 18B:
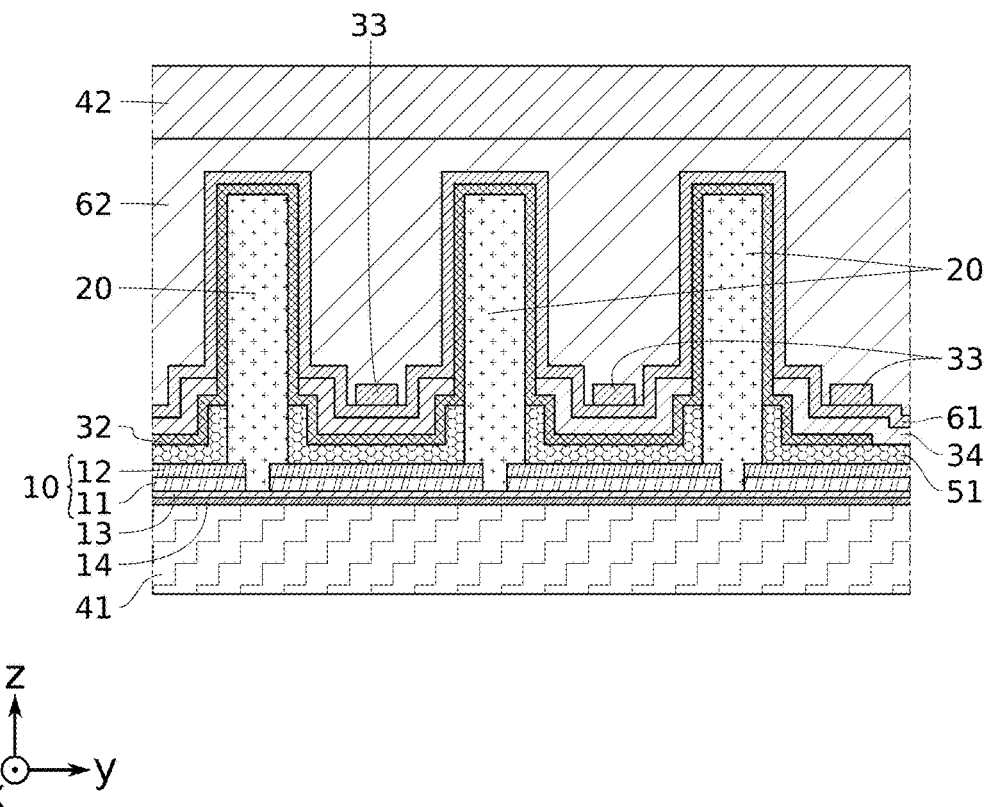

According to an alternative or combinable variant with the embodiment of the magnetic layer 33 as described above, the magnetic layer 33 can be deposited on the front face between the nanowires 20. For this, following the step described in relation to FIG. 10 for example, and as illustrated in FIGS. 17A and 17B, the magnetic layer 33 can be deposited on the metal layer 34. The passivation layer 61 can subsequently be deposited. Here again, it can be provided that the magnetic layer 33 is directly in contact with the metal layer 34, or via the passivation layer 61 when this passivation layer 61 is deposited prior to the magnetic layer 33 on the front face (see FIG. 18A). The deposition of the planarization layer 62 and the subsequent steps on the front face can then be carried out as described above and as illustrated in FIG. 18B.

After forming the first electrical contacts 31, the nanowire-based LED 20 can be connected on the back face, either directly to an electrical power supply or to LED control electronics, for example based on CMOS (Complementary Metal-Oxide-Semiconductor) transistor technology. The handling substrate 42 can be removed, where applicable.

Figure 19:
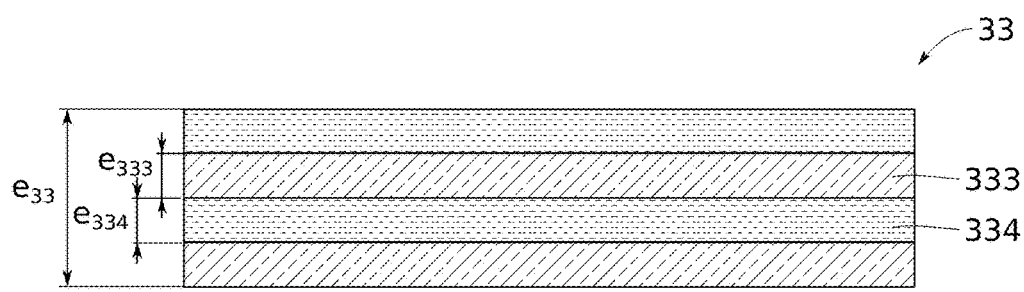
FIG. 19 schematically illustrates an alternative embodiment of the magnetic layer, according to an exemplary embodiment of the present invention.

The magnetic layer 33 is now described in more detail. The magnetic layer 33 can be based on or made of a ferromagnetic material, for example a ferromagnetic material comprising at least one among Co, Fe and Ni, such as CoFeB, CoFe, NiW, NiFe. The magnetic layer 33 can be formed from a single magnetic monolayer. As illustrated for example in FIG. 19, the magnetic layer 33 can comprise a stack of sublayers 333, 334. This stack can have a Metal/Ferromagnetic/Metal type structure, wherein a ferromagnetic sublayer 333 is interposed between two metallic and non-magnetic sublayers 334. The metal and non-magnetic sublayers 334 can be based on or made of at least one among Pt, Pd, Ru, Cr, Ta. The sublayers 334, 334 can have thicknesses $e_{333}$, $e_{334}$ of the order of a few nanometers.

The magnetic layer preferably has a total thickness $e_{33}$ ranging from one to several tens of nanometers, for example between 0.5 nm and 50 nm, preferably between 10 and 30 nm in order to generate a sufficient magnetic field in relation to the height of the 3D structure 20.

Figure 20:
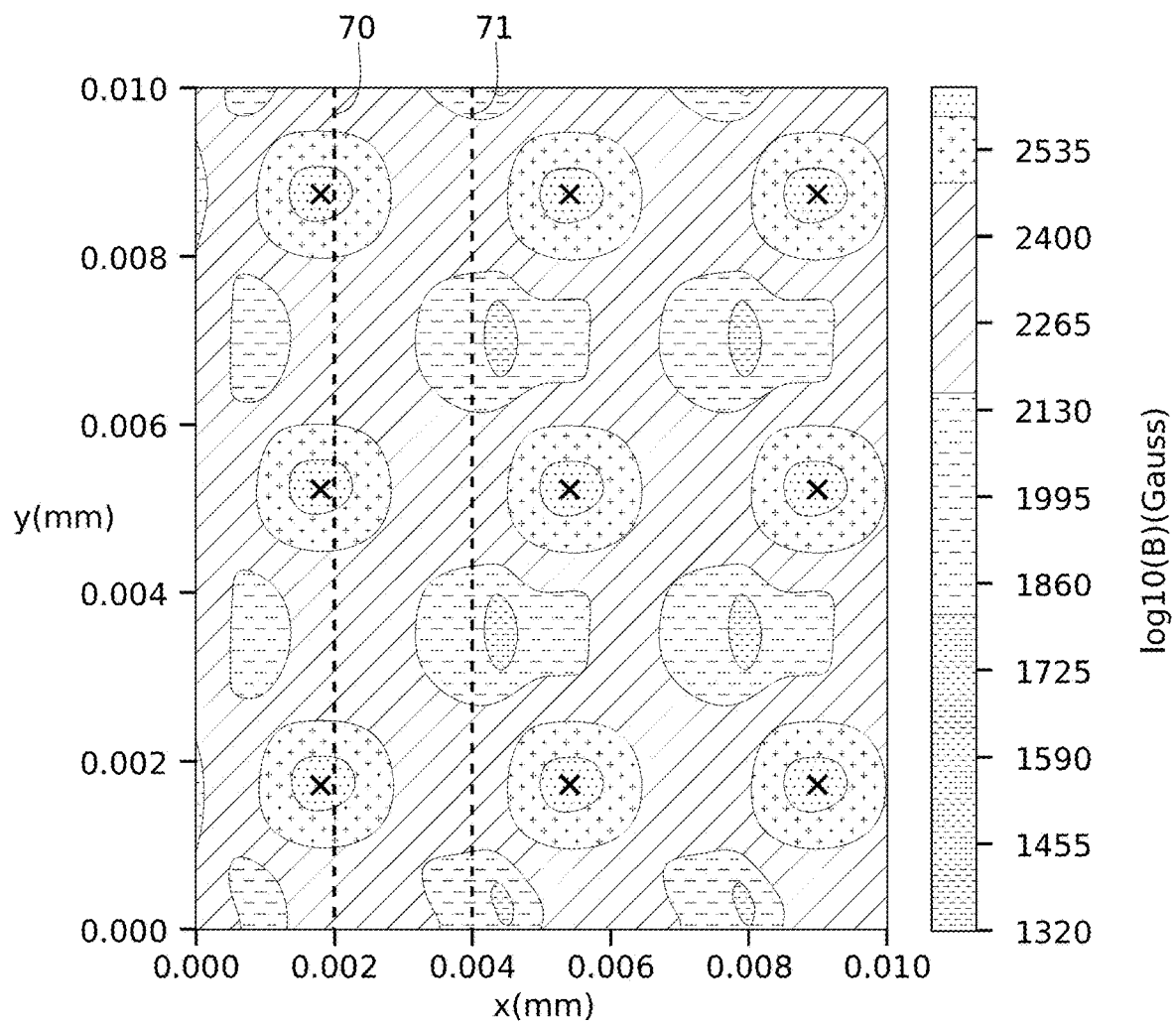
FIGS. 20 and 21 illustrate generated magnetic field simulation results for a relative arrangement of the 3D structures and the patterns of the magnetic layer as illustrated in FIG. 4A, according to an exemplary embodiment of the present invention.
Figure 21:
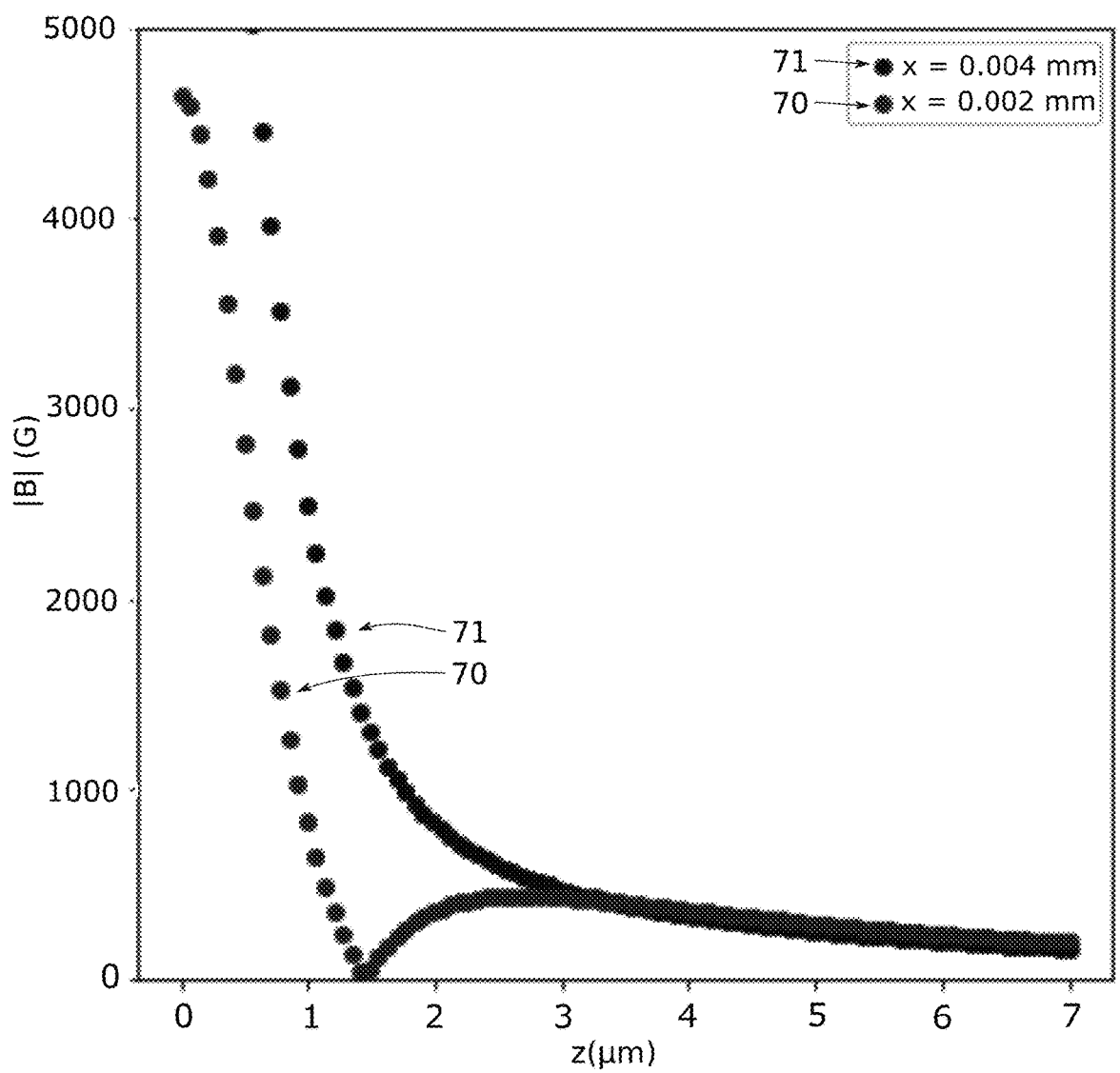

FIGS. 20 and 21 illustrate a magnetic field simulation that can be obtained for an arrangement of nanowires as illustrated in FIG. 4A, with a polarization of 0.5 T. In FIG. 20, the locations of the nanowires are marked with a black cross. FIG. 20 illustrates the magnetic field obtained at the surface of the magnetic layer 33, showing the local magnetic field maxima B obtained by structuring the magnetic layer 33 in patterns. FIG. 21 shows the evolution along the direction z of the magnetic field B in the axis of the nanowires with a polarization of 0.5 T, along the sectional planes 70 and 71. A sufficient magnetic field can be generated in a substantial part of a 5 µm high nanowire LED, from a 0.5 T magnetization of the magnetic layer 33 located at the base of the wire.

It is apparent from the description above that the 3D LED according to the invention is more efficient than a conventional 3D LED.

The invention is not limited to the embodiments described above and extends to all the embodiments covered by the invention. The present invention is not limited to the examples described above. Many other alternative embodiments are possible, for example by combination of features described above, without going beyond the context of the invention. Moreover, the features described relative to one aspect of the invention can be combined with another aspect of the invention. Unless incompatible, technical features described in detail for a given embodiment may be combined with the technical features described in the context of other embodiments described for exemplary and non-limiting purposes, so as to form another embodiment which is not necessarily illustrated or described. Of course, such an embodiment is not excluded from the invention.

The invention claimed is:

1. A light-emitting diode comprising at least one radial three-dimensional (3D) structure comprising:
    a core having a first conductivity of a first carrier type, the core having a wire or pyramidal shape oriented along a direction z, and having edges substantially parallel or oblique to the direction z,
    an active region configured to emit a light radiation of wavelength k, the active region comprising at least one radial part covering the edges of the core, and
    a shell having a second conductivity of a second carrier type, the shell covering at least the radial part of the active region,
    wherein the light-emitting diode comprises at least one magnetic layer configured to have a polarization along a main direction substantially parallel to the direction z, so as to increase a residence time at the active region of at least one among the first type and the second type of carriers.

2. The light-emitting diode according to claim 1, wherein the carriers of the first type are electrons and the first conductivity is N-type, the carriers of the second type are holes and the second conductivity is P-type, the at least one magnetic layer being configured so as to increase the residence time at the active region of the electrons propagated in the core.

3. The light-emitting diode according to claim 1, wherein the at least one magnetic layer extends in a main extension plane substantially perpendicular to the direction z and comprises patterns distributed according to a pitch p along at least one direction of said main extension plane, so as to form a plurality of portions devoid of magnetic material.

4. The light-emitting diode according to claim 3, comprising a plurality of radial 3D structures, the plurality of radial 3D structures being distributed according to a same pitch p as the patterns of the at least one magnetic layer.

5. The light-emitting diode according to claim 1, wherein the at least one magnetic layer has a polarization between 0.1 T and 1.5 T.

6. The light-emitting diode according to claim 1, wherein the at least one magnetic layer is based on a ferromagnetic material.

7. The light-emitting diode according to claim 1, wherein the at least one magnetic layer comprises a stack of sublayers, said stack comprising at least one first sublayer based on or made of a ferromagnetic material, disposed between two second sublayers based on a non-magnetic metal material.

8. The light-emitting diode according to claim 1, wherein the at least one magnetic layer has a thickness between 0.5 nm and 50 nm.

9. The light-emitting diode according to claim 1, wherein:
    the edges of the core are substantially parallel to the direction z, and
    the radial part of the active region extends along a main extension direction substantially parallel to the direction z.

10. The light-emitting diode according to claim 1, the diode further comprising:
    a first electrically conducting contact configured to inject carriers of the first type into the core, and
    a second electrically conducting contact configured to inject carriers of the second type into the shell.

11. The light-emitting diode according to claim 10, wherein the magnetic layer is subjacent, along the direction z, to the first contact.

12. The light-emitting diode according to claim 11, the diode further comprising at least one electrically insulating layer interposed between the at least one magnetic layer and the first contact.

13. The light-emitting diode according to claim 1, further comprising a masking layer having a bottom face, a top face, and openings, and wherein the core passes through the masking layer at said openings.

14. The light-emitting diode according to claim 13, wherein the at least one magnetic layer is above, along the direction z, the masking layer.

15. A method for producing the light-emitting diode comprising the at least one radial three-dimensional (3D) structure according to claim 1, the method comprising:
   forming the core by epitaxy on a growth substrate, by localized growth through an opening of a masking layer disposed on said growth substrate,
   forming the active region by epitaxy on the core,
   forming the shell by epitaxy on the active region, then
   depositing the at least one magnetic layer such that said magnetic layer has a polarization along a main direction substantially parallel to the direction z.

16. The method according to claim 15, further comprising:
   depositing a planarization layer on the growth substrate, on and around the at least one 3D structure protruding from the growth substrate, so as to obtain a planar surface above the at least one 3D structure,
   bonding a handling substrate on said planar surface, and
   removing the growth substrate so as to expose the masking layer and a portion of the core through the masking layer.

17. The method according to claim 16, further comprising:
   after removing the growth substrate, forming a first contact in contact with the exposed portion of the core,
   following the formation of the first contact, depositing the magnetic layer on a bottom face of the masking layer.

18. The method according to claim 15, further comprising:
   forming a second contact on the shell, by depositing a transparent conducting oxide layer, and
   depositing the magnetic layer on the second contact.

19. The light-emitting diode according to claim 3, wherein said patterns are distributed according to a first lattice of pitch p, along two separate directions of said main extension plane.

20. The light-emitting diode according to claim 1, wherein the at least one magnetic layer has a thickness between 10 nm and 30 nm.

\* \* \* \* \*